(12) United States Patent
Kamata et al.

(10) Patent No.: US 7,813,182 B2
(45) Date of Patent: Oct. 12, 2010

(54) SEMICONDUCTOR MEMORY

(75) Inventors: Yoshihiko Kamata, Yokohama (JP); Takayuki Harima, Kawaguchi (JP); Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 12/272,118

(22) Filed: Nov. 17, 2008

(65) Prior Publication Data

US 2009/0135657 A1 May 28, 2009

(30) Foreign Application Priority Data

Nov. 20, 2007 (JP) ............................. 2007-300474

(51) Int. Cl.
*G11C 16/28* (2006.01)

(52) U.S. Cl. .................. 365/185.21; 365/185.2; 365/210.1

(58) Field of Classification Search ............. 365/210.12
See application file for complete search history.

(56) References Cited

U.S. PATENT DOCUMENTS

| 6,016,272 | A | 1/2000 | Gerna et al. |
| 7,167,394 | B2 * | 1/2007 | La Placa et al. .......... 365/185.2 |
| 7,184,345 | B2 | 2/2007 | Tran et al. |

FOREIGN PATENT DOCUMENTS

JP     2007-42193     2/2007

* cited by examiner

*Primary Examiner*—Tan T. Nguyen
(74) *Attorney, Agent, or Firm*—Oblon, Spivak, McClelland, Maier & Neustadt, L.L.P.

(57) ABSTRACT

A semiconductor memory has a first-stage amplifier circuit, wherein data stored in a memory cells is read based on a potential between an amplifier input MOS transistor and an amplifier reference MOS transistor, the potential being outputted from the first-stage amplifier circuit.

17 Claims, 16 Drawing Sheets

RELATIONSHIP BETWEEN
MULTIVALUED DATA AND SOUT

| Data | SOUT 1 | | SOUT 2 | | SOUT 3 | |
|---|---|---|---|---|---|---|
| 00 | L | Icell<Iref1 | L | Icell<Iref2 | L | Icell<Iref3 |
| 01 | L | Icell<Iref1 | L | Icell<Iref2 | H | Icell>Iref3 |
| 10 | L | Icell<Iref1 | H | Icell>Iref2 | H | Icell>Iref3 |
| 11 | H | Icell>Iref1 | H | Icell>Iref2 | H | Icell>Iref3 |

SEMICONDUCTOR MEMORY

CROSS-REFERENCE TO RELATED APPLICATION

This application is based upon and claims the benefit of priority from the prior Japanese Patent Application No. 2007-300474, filed on Nov. 20, 2007, the entire contents of which are incorporated herein by reference.

BACKGROUND OF THE INVENTION

1. Field of the Invention

The present invention relates to a semiconductor memory, for example, a nonvolatile semiconductor memory such as a NOR flash memory.

2. Background Art

In recent years, various kinds of semiconductor memories (flash memories) have been developed which are made up of EEPROM cells and enable electrical writing and batch erasing. For example, a reading operation and a verifying operation of a NOR flash memory are performed by comparing, in a sense amplifier (differential amplifier circuit), currents passing through a selected memory cell and a reference cell (for example, see Japanese Patent Laid-Open No. 2007-42193).

In the reading operation of a semiconductor memory according to the prior art, a reading voltage is generated by, for example, a memory cell and the current source of the memory cell. Similarly, a reference voltage is generated by the reference cell and the current source of the reference cell. The sense amplifier is fed with these generated potentials as differential voltage inputs and outputs a signal corresponding to a comparison result. Based on the signal, data stored in the memory cell is obtained.

For a fast and stable operation of the sense amplifier, a large differential potential difference is desirable. For example, when a voltage required for a stable operation of the sense amplifier is represented as "V", a time "t" for obtaining the potential difference is expressed by the following equation (1):

$$t = CV/((\text{Icell} - \text{Iload}) - (\text{Iref} - \text{Irload})) \quad (1)$$

where "C" represents the parasitic capacitance of a path from the current source on the side of the memory cell to the memory cell. In this design, an equivalent parasitic capacitance is provided for a path from the current source on the side of the reference cell to the reference cell. Further, a cell current is represented as "Icell", a reference cell current (reference current) is represented as "Iref", a supply current from the current source on the side of the memory cell is represented as "Iload", and a supply current from the current source on the side of the reference cell is represented as "Irload".

As expressed in equation (1), the time "t" gives a decision time of data stored in the memory cell, in the sense amplifier. Moreover, as semiconductor devices have been fabricated on smaller design rules in recent years, the wiring parasitic capacitance "C" tends to increase and the cell current tends to decrease. Particularly, in a semiconductor memory for storing multivalued data, a cell current difference further tends to decrease.

The tendency resulted from smaller design rules increases the reading time "t" as expressed in equation (1). In other words, in the prior art, when a semiconductor memory is fabricated on smaller design rules and is used for storing multivalued data, the reading time may increase.

SUMMARY OF THE INVENTION

According to one aspect of the present invention, there is provided: a semiconductor memory, comprising:

a first load MOS transistor of a first conductivity type which has one end connected to a power supply and is diode-connected;

nonvolatile memory cells which are connected between an other end of the first load MOS transistor and ground and have adjustable threshold voltages;

a second load MOS transistor of the first conductivity type which has one end connected to the power supply, is diode-connected, and has the same size as the first load MOS transistor;

nonvolatile reference cells which are connected between an other end of the second load MOS transistor and the ground and have adjustable threshold voltages;

a third load MOS transistor of the first conductivity type which has one end connected to the power supply, has a gate connected to a gate of the second load MOS transistor, has the same size as the first load MOS transistor, and is fed with a current obtained by current mirroring a current passing through the second load MOS transistor;

a first reference MOS transistor of a second conductivity type which is connected between an other end of the third load MOS transistor and the ground and is diode-connected;

an amplifier input MOS transistor of the first conductivity type which has one end connected to the power supply, has a gate connected to the other end of the first load MOS transistor, has the same size as the first load MOS transistor, and composes a first-stage amplifier circuit; and an amplifier reference MOS transistor of the second conductivity type which is connected between an other end of the amplifier input MOS transistor and the ground, has the same size as the first reference MOS transistor, is fed with a current obtained by current mirroring a current passing through the first reference MOS transistor, and composes the first-stage amplifier circuit, wherein data stored in the memory cells is read based on a potential between the amplifier input MOS transistor and the amplifier reference MOS transistor, the potential being outputted from the first-stage amplifier circuit.

According to the other aspect of the present invention, there is provided: a semiconductor memory, comprising:

a first load MOS transistor of a first conductivity type which has one end connected to a power supply and is diode-connected;

nonvolatile memory cells which are connected between an other end of the first load MOS transistor and ground and have adjustable threshold voltages;

a second load MOS transistor of the first conductivity type which has one end connected to the power supply, is diode-connected, and has the same size as the first load MOS transistor;

nonvolatile reference cells which are connected between an other end of the second load MOS transistor and the ground and have adjustable threshold voltages;

a third load MOS transistor of the first conductivity type which has one end connected to the power supply, has a gate connected to a gate of the second load MOS transistor, has the same size as the first load MOS transistor, and is fed with a current obtained by current mirroring a current passing through the second load MOS transistor;

a first reference MOS transistor of a second conductivity type which is connected between an other end of the third load MOS transistor and the ground and is diode-connected;

an amplifier input MOS transistor of the first conductivity type which has one end connected to the power supply, has a gate connected to the other end of the first load MOS transistor, has the same size as the first load MOS transistor, and composes a first-stage amplifier circuit; and an amplifier reference MOS transistor of the second conductivity type which is connected between an other end of the amplifier input MOS transistor and the ground, has the same size as the first reference MOS transistor, is fed with a current obtained by current mirroring a current passing through the first reference MOS transistor, and composes the first-stage amplifier circuit;

a fourth load MOS transistor of the first conductivity type which has one end connected to the power supply, is diode-connected, and has the same size as the first load MOS transistor;

a second reference MOS transistor of the second conductivity type which is connected between an other end of the fourth load MOS transistor and the ground, has a gate connected to a gate of the first reference MOS transistor, has the same size as the first reference MOS transistor, and is fed with the current obtained by current mirroring the current passing through the first reference MOS transistor;

dummy cells connected in parallel with the second reference MOS transistor between the other end of the fourth load MOS transistor and the ground; and a differential amplifier circuit which is fed with the potential between the amplifier input MOS transistor and the amplifier reference MOS transistor as an output from the first-stage amplifier circuit and is fed with a potential between the fourth load MOS transistor and the second reference MOS transistor, compares these potentials, and outputs a signal corresponding to a comparison result, wherein data stored in the memory cells is read based on an output signal of the differential amplifier circuit.

According to still further aspect of the present invention, there is provided: a semiconductor memory, comprising:

a first load MOS transistor of a first conductivity type which has one end connected to a power supply and is diode-connected;

nonvolatile memory cells which are connected between an other end of the first load MOS transistor and ground and have adjustable threshold voltages;

a second load MOS transistor of the first conductivity type which has one end connected to the power supply, is diode-connected, and has the same size as the first load MOS transistor;

nonvolatile reference cells which are connected between an other end of the second load MOS transistor and the ground and have adjustable threshold voltages;

a third load MOS transistor of the first conductivity type which has one end connected to the power supply, has a gate connected to a gate of the second load MOS transistor, has the same size as the first load MOS transistor, and is fed with a current obtained by current mirroring a current passing through the second load MOS transistor;

a first reference MOS transistor of a second conductivity type which is connected between an other end of the third load MOS transistor and the ground and is diode-connected;

an amplifier input MOS transistor of the first conductivity type which has one end connected to the power supply, has a gate connected to the other end of the first load MOS transistor, has the same size as the first load MOS transistor, and composes a first-stage amplifier circuit; and an amplifier reference MOS transistor of the second conductivity type which is connected between an other end of the amplifier input MOS transistor and the ground, has the same size as the first reference MOS transistor, is fed with a current obtained by current mirroring a current passing through the first reference MOS transistor, and composes the first-stage amplifier circuit; and a differential amplifier circuit which is fed with the potential between the amplifier input MOS transistor and the amplifier reference MOS transistor as an output from the first-stage amplifier circuit and is fed with a potential between a power supply potential and a ground potential, compares these potentials, and outputs a signal corresponding to a comparison result, wherein data stored in the memory cells is read based on an output signal of the differential amplifier circuit.

DETAILED DESCRIPTION

Comparative Example

Figure 1:
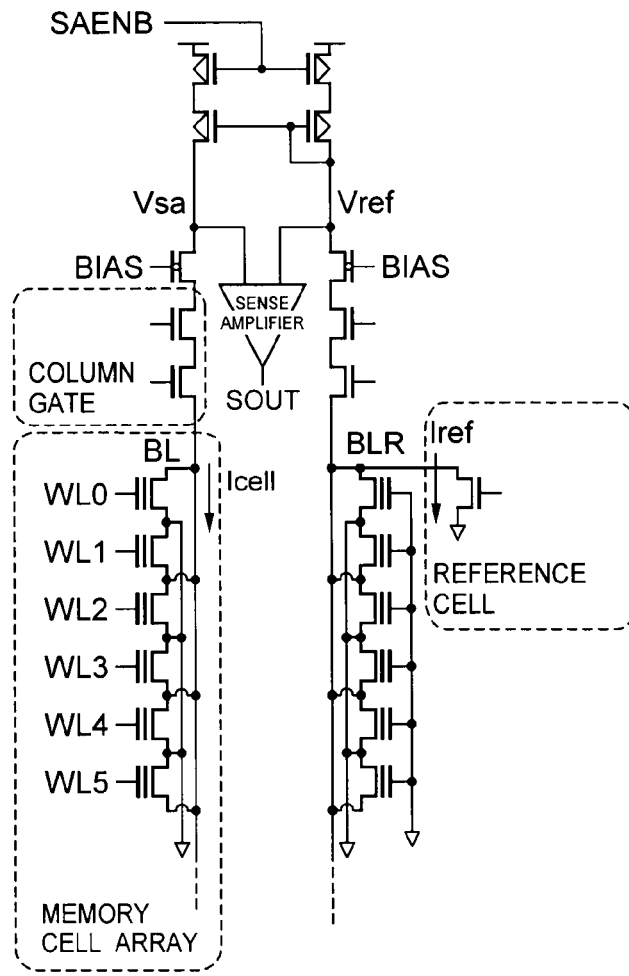
FIG. 1 shows an example of the circuit configuration of a semiconductor memory (NOR flash memory) as a comparative example.

FIG. 1 shows an example of the circuit configuration of a semiconductor memory (NOR flash memory) as a comparative example.

As has been discussed, in a reading operation of the semiconductor memory shown in FIG. 1, a reading voltage (Vsa) is generated by, for example, a memory cell and the current source of the memory cell. Similarly, a reference voltage (Vref) is generated by a reference cell and the current source of the reference cell. A sense amplifier (differential amplifier circuit) is fed with these generated potentials as differential voltage inputs and outputs a signal (SOUT) corresponding to a comparison result. Based on the signal, data stored in the memory cell is obtained.

Figure 2:
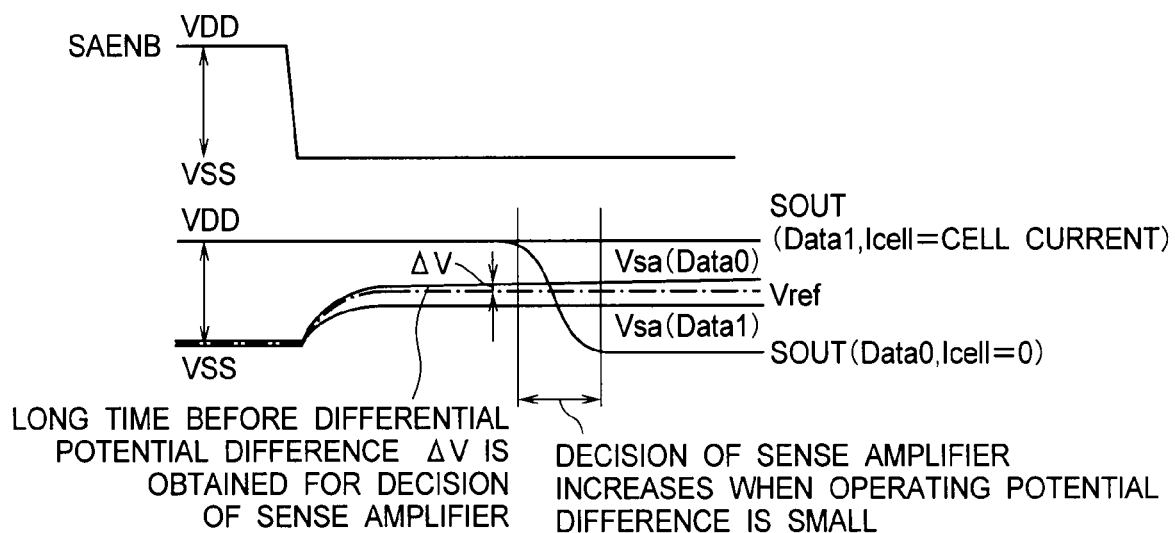
FIG. 2 shows the signal waveforms of the sense amplifier in the semiconductor memory of the prior art shown in FIG. 1.

FIG. 2 shows the signal waveforms of the sense amplifier in the semiconductor memory of the prior art shown in FIG. 1. As shown in FIG. 2, a signal SAENB changes from "High" to "Low" and the reading voltage (Vsa) and the reference voltage (Vref) increase. As has been discussed, for example, when a cell current decreases in response to multivalued data in the semiconductor memory of FIG. 1, it takes a longer time before a differential potential difference ΔV between these voltages becomes large enough to enable a decision in the sense amplifier.

In the case where a decision is started with a small differential potential difference ΔV, for example, when a wiring parasitic capacitance increases with smaller design rules, the decision time of the sense amplifier increases.

In this way, in the semiconductor memory of the prior art, the reading time may increase in response to smaller design rules and stored multivalued data.

In order to address the problem found by the applicant, embodiments to which the present invention is applied will be described below with reference to the accompanying drawings.

In the following embodiments, a MOS transistor of a first conductivity type is a pMOS transistor and a MOS transistor of a second conductivity type is an nMOS transistor. The polarities of a circuit may be changed to obtain similar operations. Thus a MOS transistor of a first conductivity type may be an nMOS transistor and a MOS transistor of a second conductivity type may be a PMOS transistor.

First Embodiment

Figure 3:
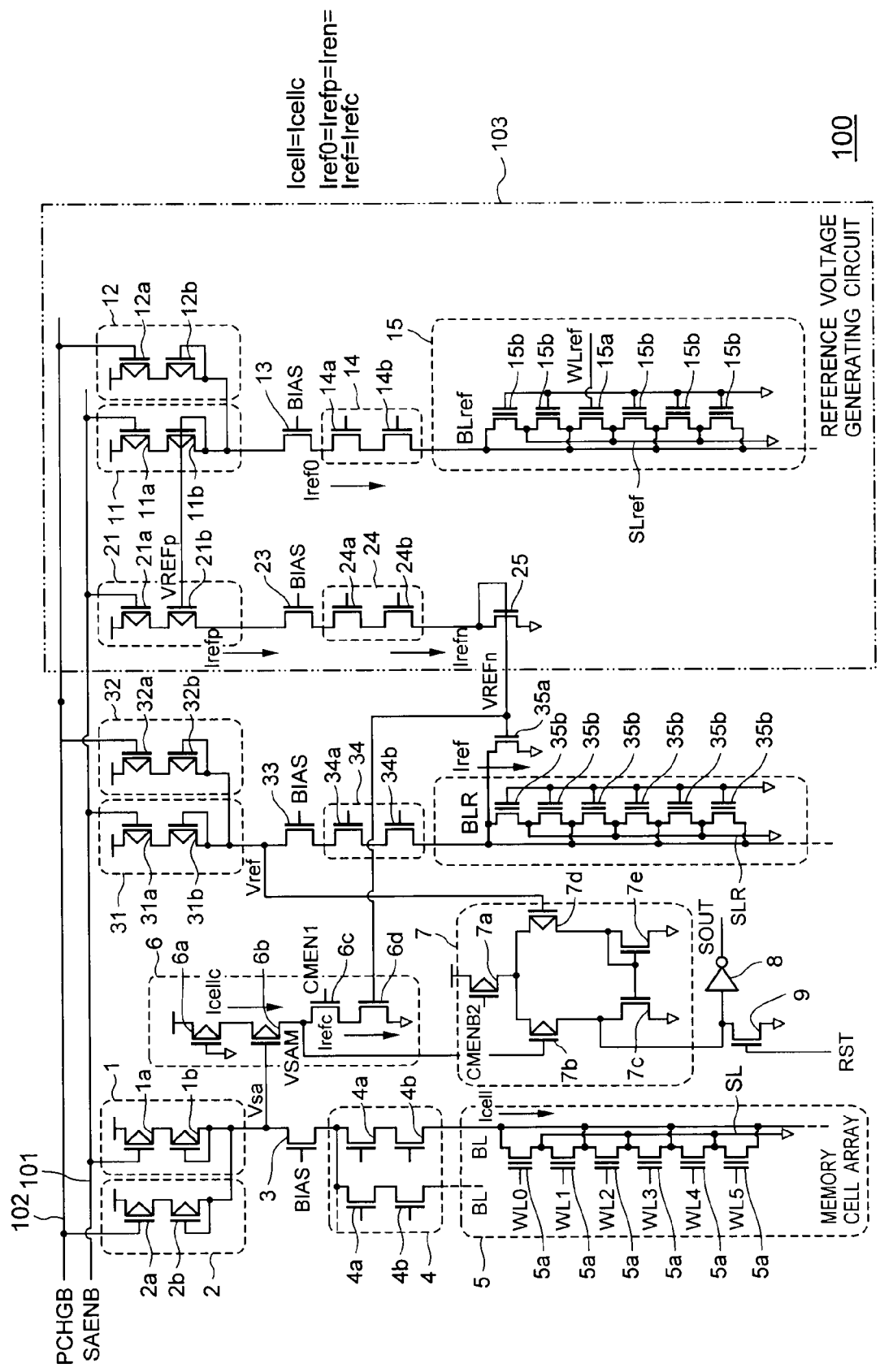
FIG. 3 is a circuit diagram showing the main configuration of a semiconductor memory (NOR flash memory) 100 according to a first embodiment which is an aspect of the present invention.

FIG. 3 is a circuit diagram showing the main configuration of a semiconductor memory (NOR flash memory) 100 according to a first embodiment which is an aspect of the present invention. As shown in FIG. 3, the semiconductor memory 100 includes a current source 1, an auxiliary current source 2 for supplementing a current outputted from the current source 1, an nMOS transistor 3, a column gate 4, and a memory cell array 5.

The current source 1 includes a pMOS transistor 1a having one end (source) connected to a power supply and the gate connected to a first wire 101 fed with a signal SAENB is applied, and a load MOS transistor 1b which has one end (source) connected to the power supply via the pMOS transistor 1a and is a diode-connected pMOS transistor.

The auxiliary current source 2 includes a pMOS transistor 2a having one end (source) connected to the power supply and the gate connected to a second wire 102 fed with a signal PCHGB, and a load MOS transistor 2b which has one end (source) connected to the power supply via the pMOS transistor 2a and is a diode-connected pMOS transistor.

The nMOS transistor 3 has one end (drain) connected to the other ends (drains) of the load MOS transistors 1b and 2b. The threshold voltage of the nMOS transistor 3 is set around 0 V, and a predetermined fixed voltage BIAS not lower than the threshold value is applied to the nMOS transistor 3.

The column gate 4 is made up of nMOS transistors 4a and 4b connected in series between the other end (source) of the nMOS transistor 3 and bit lines BL. The gates of the nMOS transistors 4a and 4b are connected to a column selecting line, and the bit lines BL are selected in response to a signal applied to the column selecting line.

The memory cell array 5 is configured such that memory cells 5a are disposed at the intersection points of the multiple bit lines BL and multiple word lines WL0 to WL5. The memory cell 5a is made up of, for example, a nonvolatile transistor (for example, an EEPROM cell where a threshold value can be adjusted by injecting electrons into a floating gate or trapping electrons in a nitride film serving as a charge storage layer) having an adjustable threshold voltage. The drains of the memory cells 5a disposed in each column are connected to the corresponding bit line BL.

The gates (control gates) of the memory cells 5a are connected to the word lines WL0 to WL5. The sources of the memory cells 5a are connected to the ground via a common source line SL. In other words, the memory cells 5a are connected between the other end (drain) of the pMOS transistor 1b and the ground via the nMOS transistor 3 and the column gate 4.

As shown in FIG. 3, the semiconductor memory 100 further includes a reference voltage generating circuit 103. The reference voltage generating circuit 103 includes a current source 11, an auxiliary current source 12 for supplementing a current outputted from the current source 11, an nMOS transistor 13, a dummy column gate 14, and a reference cell array 15.

The current source 11 includes a PMOS transistor 11a having one end (source) connected to the power supply and the gate connected to the first wire 101, and a load MOS transistor 11b which has one end (source) connected to the power supply via the PMOS transistor 11a and is a diode-connected PMOS transistor. The load MOS transistor 11b has the same size as the load MOS transistor 1b.

The auxiliary current source 12 includes a PMOS transistor 12a which has one end (source) connected to the power supply and the gate connected to the second wire 102, and a load MOS transistor 12b which has one end (source) connected to the power supply via the pMOS transistor 12a and is a diode-connected pMOS transistor.

The nMOS transistor 13 has one end (drain) connected to the other ends (drains) of the load MOS transistors 11b and 12b. The threshold voltage of the nMOS transistor 13 is set around 0 V, and the predetermined fixed voltage BIAS not lower than the threshold value is applied to the nMOS transistor 13.

The dummy column gate 14 is made up of nMOS transistors 14a and 14b connected in series between the other end (source) of the nMOS transistor 13 and a reference bit line BLref. A predetermined voltage is applied to the gates of the nMOS transistors 14a and 14b. Thus the parasitic capacitances of the nMOS transistors 4a and 4b are equal to the parasitic capacitances of the nMOS transistors 14a and 14b.

The reference cell array 15 is configured such that a reference cell array 15a and dummy cells 15b are connected to the reference bit line BLref.

The reference cell 15a is made up of, for example, a non-volatile transistor (for example, an EEPROM cell where a threshold value can be adjusted by injecting electrons into a floating gate or trapping electrons in a nitride film serving as a charge storage layer) which has the same configuration and size as the memory cell 5 and has an adjustable threshold voltage. The drain of the reference cell 15a is connected to the corresponding reference bit line BLref.

The gate (control gate) of the reference cell 15a is connected to a wire WLref and is fed with a predetermined voltage. The source of the reference cell 15a is connected to the ground via a common source line SLref. In other words, the reference cell 15a is connected between the other end (drain) of the pMOS transistor 11b and the ground via the nMOS transistor 13 and the dummy column gate 14.

The dummy cell 15b is made up of, for example, a non-volatile transistor which has the same configuration and size as the memory cell 5a and the reference cell 15a and has an adjustable threshold voltage.

The drains of the dummy cells 15b are connected to the corresponding reference bit line BLref. The gates (control gates) of the dummy cells 15b are connected to the ground. The sources of the dummy cells 15b are connected to the ground via the common source line SLref. Thus the dummy cells 15b are in an off state.

As described above, since the reference cell array 15 includes the reference cell 15a and the dummy cells 15b, the parasitic capacitance of the reference cell array 15 is equal to the parasitic capacitance of the memory cell array 5. Thus a path from the current source to the reference cell 15a has a parasitic capacitance equivalent to the parasitic capacitance of a path from the current source to the memory cell 5a.

The reference voltage generating circuit 103 further includes a current source 21, an nMOS transistor 23, a dummy column gate 24, and a reference MOS transistor 25.

The current source 21 includes a pMOS transistor 21a having one end (source) connected to the power supply and the gate connected to the first wire 101, and a load MOS transistor 21b which is a pMOS transistor having one end (source) connected to the power supply via the PMOS transistor 21a and the gate connected to the gate of the load MOS transistor 11b. The load MOS transistor 21b has the same size as the load MOS transistors 1b and 11b.

Thus the load MOS transistor 21b is fed with a current Irefp obtained by current mirroring a current Iref0 passing through the load MOS transistor 11b, and the current value of the current Iref0 and the current value of the current Irefp are equal to each other.

The nMOS transistor 23 has one end (drain) connected to the other end (drain) of the load MOS transistor 21b. The threshold voltage of the nMOS transistor 23 is set around 0 V and the predetermined fixed voltage BIAS not lower than the threshold value is applied to the nMOS transistor 23.

The dummy column gate 24 is made up of nMOS transistors 24a and 24b connected in series between the nMOS transistor 23 and the reference MOS transistor 25. A predetermined voltage is applied to the gates of the nMOS transistors 24a and 24b. Thus the parasitic capacitances of the nMOS transistors 4a and 4b are equal to the parasitic capacitances of the nMOS transistors 24a and 24b.

The reference MOS transistor 25 is a diode-connected nMOS transistor. The n MOS transistor has one end (source) connected to the other end (drain) of the load MOS transistor 21a via the dummy column gate 24 and the nMOS transistor 23. In other words, the reference MOS transistor 25 is connected between the other end (drain) of the load MOS transistor 21a and the ground. In this case, a current Irefn passing through the reference MOS transistor 25 is equal to the current Irefp outputted from the current source 21.

As shown in FIG. 3, the semiconductor memory 100 further includes a current source 31, an auxiliary current source 32 for supplementing a current outputted from the current source 31, an nMOS transistor 33, a column gate 34, a reference MOS transistor 35a, and dummy cells 35b.

The current source 31 includes a pMOS transistor 31a having one end (source) connected to the power supply and the gate connected to the first wire 101, and a load MOS transistor 31b which has one end (source) connected to the power supply via the pMOS transistor 31a and is a diode-connected pMOS transistor. The load MOS transistor 31b has the same size as the load MOS transistors 1b, 11b and 21b.

The auxiliary current source 32 includes a PMOS transistor 32a having one end (source) connected to the power supply and has the gate connected to the wire 102, and a load MOS transistor 32b which has one end (source) connected to the power supply via the PMOS transistor 32a and is a diode-connected pMOS transistor.

The nMOS transistor 33 has one end (drain) connected to the other ends (drains) of the load MOS transistors 31b and 32b. The threshold voltage of the nMOS transistor 33 is set around 0 V, and the predetermined fixed voltage BIAS not lower than the threshold voltage is applied to the nMOS transistor 33.

The dummy column gate 34 is made up of nMOS transistors 34a and 34b connected in series between the nMOS transistor 33 and a reference MOS transistor 35. A predetermined voltage is applied to the gates of the nMOS transistors 34a and 34b. Thus the parasitic capacitances of the nMOS transistors 4a and 4b are equal to the parasitic capacitances of the nMOS transistors 34a and 34b.

The reference MOS transistor 35a is an nMOS transistor which has the same size as the reference MOS transistor 25 and shares the gate with the reference MOS transistor 25 in a current mirror connection.

The nMOS transistor has one end (source) connected to the other ends (drains) of the load MOS transistors 31a and 32a via the dummy column gate 34 and the nMOS transistor 33. In other words, the reference MOS transistor 35a is connected between the other ends (drains) of the load MOS transistors 31a and 32a and the ground.

Thus the reference MOS transistor 35a is fed with a current Iref obtained by current mirroring the current Irefn passing through the reference MOS transistor 25, and the current value of the current Irefn and the current value of the current Iref are equal to each other.

The drains of the dummy cells 35b are connected to a corresponding dummy bit line BLR. The gates (control gates) of the dummy cells 35b are connected to the ground. The sources of the dummy cells 35b are connected to the ground via a common source line SLR. Thus the dummy cells 35b are in an off state.

Further, the dummy cells 35b are set to have a parasitic capacitance equal to the parasitic capacitance of the memory cell 5a of the memory cell array 5. Thus the parasitic capacitances between the bit lines BL and the dummy bit line BLR are equal to each other, achieving current mirroring with higher accuracy.

As shown in FIG. 3, the semiconductor memory 100 further includes a first-stage amplifier circuit 6, a differential amplifier circuit 7, an inverter 8, and a reset circuit 9.

The first-stage amplifier circuit 6 includes a pMOS transistor 6a, an amplifier input MOS transistor 6b, an nMOS transistor 6c, and an amplifier reference MOS transistor 6d.

The pMOS transistor 6a has one end (source) connected to the power supply and the gate connected to the ground. The amplifier input MOS transistor 6b is a pMOS transistor having one end (source) connected to the power supply via the pMOS transistor 6a. The amplifier input MOS transistor 6b has the gate connected to the other end (drain) of the load MOS transistor 1b and fed with a voltage Vsa. The amplifier input MOS transistor 6b has the same size as the load MOS transistor 1b. Thus a current Icell and a current Icellc are equal to each other.

The nMOS transistor 6c is connected between the amplifier input MOS transistor 6b and the amplifier reference MOS transistor 6d. The gate of the nMOS transistor 6c is fed with a signal CMEN1. The nMOS transistor 6c is turned on/off in response to the signal CMEN1 to control the operation of the first-stage amplifier circuit 6.

The amplifier reference MOS transistor 6d is an nMOS transistor having one end (source) connected to the other end (drain) of the load MOS transistor 6b via the PMOS transistor 6c and the other end connected to the ground.

The amplifier reference MOS transistor 6d has the gate connected to the gate of the reference MOS transistor 25 and fed with a potential VREFn. Further, the amplifier reference MOS transistor 6d has the same size as the reference MOS transistors 25 and 35a. Thus the current Irefn and a current Irefc are equal to each other.

The amplifier reference MOS transistor 6d is therefore fed with the current Irefc obtained by current mirroring the current Irefn passing through the reference MOS transistor 25. Thus the current value of the current Irefn and the current value of the current Irefc are equal to each other.

As described above, the first-stage amplifier circuit 6 is configured such that the circuit for passing the current Icellc obtained by current mirroring the current Icell of the memory cell 5a and the circuit for passing the current Irefc obtained by current mirroring the current Iref of the reference cell 15a are connected in series.

Further, a potential between the amplifier input MOS transistor 6b and the amplifier reference MOS transistor 6d is outputted as an output signal VSAM of the first-stage amplifier circuit 6. In other words, the first-stage amplifier circuit 6 outputs the output signal VSAM according to the potential Vsa. For example, when the potential Vsa increases, the current Icellc increases and the potential of the output signal VSAM decreases. When the potential Vsa decreases, the current Icellc is limited and the potential of the output signal VSAM increases.

The first-stage amplifier circuit 6 has a small capacitance and thus the output signal VSAM of the first-stage amplifier circuit 6 quickly moves to an operating point obtained by a difference between the current Icellc and the current Irefc.

The differential amplifier circuit 7 includes pMOS transistors 7a, 7b and 7d and nMOS transistors 7c and 7e. The pMOS transistor 7a has one end (source) connected to the power supply and the gate fed with a signal CMENB2 for controlling the operation of the differential amplifier circuit 7.

The pMOS transistor 7b has one end (source) connected to the other end (drain) of the pMOS transistor 7a and the gate connected to the other end (drain) of the amplifier input MOS transistor 6b.

The nMOS transistor 7c has one end (drain) connected to the other end (drain) of the pMOS transistor 7b and the other end (source) connected to the ground. The pMOS transistor 7d has one end (source) connected to the other end (drain) of the pMOS transistor 7a and the gate connected to the other end (drain) of the load MOS transistor 31b.

The nMOS transistor 7e has one end (drain) connected to the other end (drain) of the pMOS transistor 7d and the other end (source) connected to the ground. Further, the nMOS transistor 7e has the gate connected to the gate of the nMOS transistor 7c and is diode connected.

The differential amplifier circuit 7 configured thus is fed with the output potential VSAM of the first-stage amplifier circuit 6 and a potential Vref between the load MOS transistor 31b and the reference MOS transistor 35a, compares these potentials, and outputs a signal corresponding to the comparison result.

The inverter 8 outputs a signal SOUT which has a phase inverted from the output signal of the differential amplifier circuit 7. Based on the signal SOUT, data stored in the memory cells 5a is read. In other words, the signal SOUT is generated based on the output signal VSAM of the first-stage amplifier circuit 6, and then data stored in the memory cells 5a is read.

The reset circuit 9 is made up of, for example, an nMOS transistor which is connected between the output of the differential amplifier circuit 7 and the ground and has the gate fed with a signal RST. The reset circuit 9 resets a signal inputted to the inverter 8 to "Low", in response to the signal RST.

The following will describe the operations of the semiconductor memory 100 configured thus.

Figure 4:
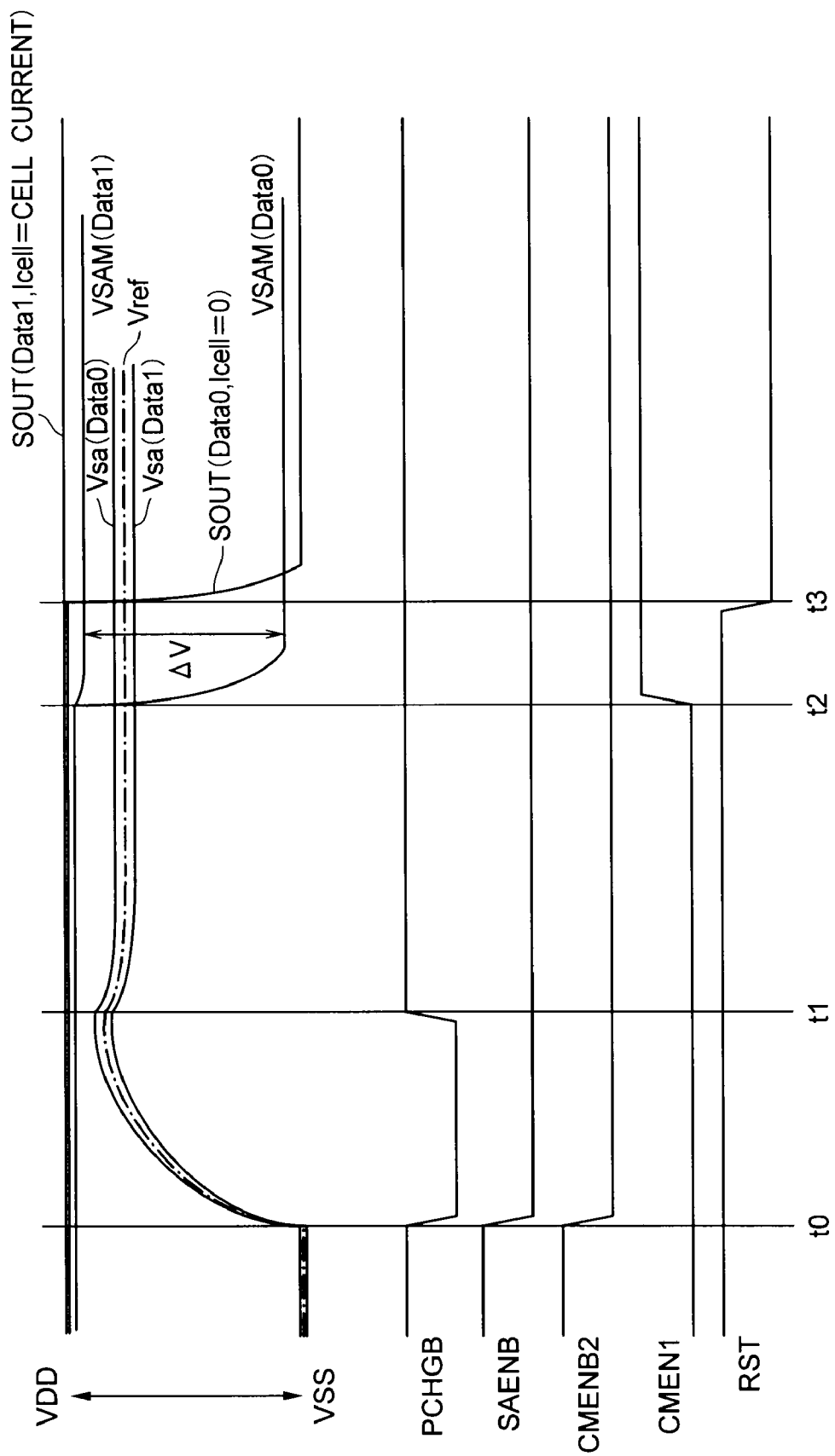
FIG. 4 shows the waveforms of the signals of the semiconductor memory 100 shown in FIG. 3.

FIG. 4 shows the waveforms of the signals of the semiconductor memory 100 shown in FIG. 3. As shown in FIG. 4, the signals PCHGB, SAENB, and CMENB2 change from "High" to "Low" at time t0, so that the current sources 1, 11, 21 and 31 and auxiliary current sources 2, 12 and 32 are activated and the potentials Vsa and Vref increase.

Next, at time t1, the signal PCHGB becomes "High" and the auxiliary current sources 2, 12 and 32 are deactivated. Thus a precharging operation is completed and the current Icell corresponding to data stored in the memory cells 5a is passed.

Next, at time t2, the signal CMEN1 changes from "Low" to "High" and the first-stage amplifier circuit 6 is activated.

When the data stored in the memory cells 5a is Data1, the current Icell is equal to a cell current passing through the memory cells 5a, so that the potential Vsa becomes lower than the potential Vref. Thus the first-stage amplifier circuit 6 outputs the output potential VSAM (Data1).

When the data stored in the memory cells 5a is Data0, the current Icell does not pass, so that the potential Vsa becomes higher than the potential Vref. Thus the first-stage amplifier circuit 6 outputs the output potential VSAM (Data0) lower than the output potential VSAM (Data1).

As described above, the first-stage amplifier circuit 6 has a small capacitance and thus the potential VSAM which is the output of the first-stage amplifier circuit 6 quickly moves to an operating point obtained by a difference between the current Icell and the current Iref. It is therefore possible to quickly obtain a desired differential input potential difference ΔV for the differential amplifier circuit 7.

Next, at time t3, the signal RST changes from "High" to "Low", the reset of the reset circuit 9 is canceled, and a signal corresponding to the comparison result of the differential amplifier circuit 7 between the potential VSAM and the potential Vref is inputted to the inverter 8. Then, the inverter 8 outputs the inverted signal of the signal as SOUT.

In this case, even when a wiring parasitic capacitance increases with smaller design rules, the decision time of the differential amplifier circuit 7 can be shortened by the sufficiently large differential potential difference ΔV.

As described above, the semiconductor memory of the present embodiment can further reduce a reading time. The present embodiment is particularly effective for a memory fabricated on smaller design rules with a reduced cell current and a multivalued memory having a reduced difference between a cell current and a reference current.

In the present embodiment, data stored in the memory cells is read based on the output signal of the differential amplifier circuit. Data stored in the memory cells may be read based on the output of the first-stage amplifier circuit.

Second Embodiment

The first embodiment described an example of the configuration for reading data stored in the memory cells. The present embodiment will particularly describe an example of a configuration for reading data stored in multivalued memory cells.

Figure 5:
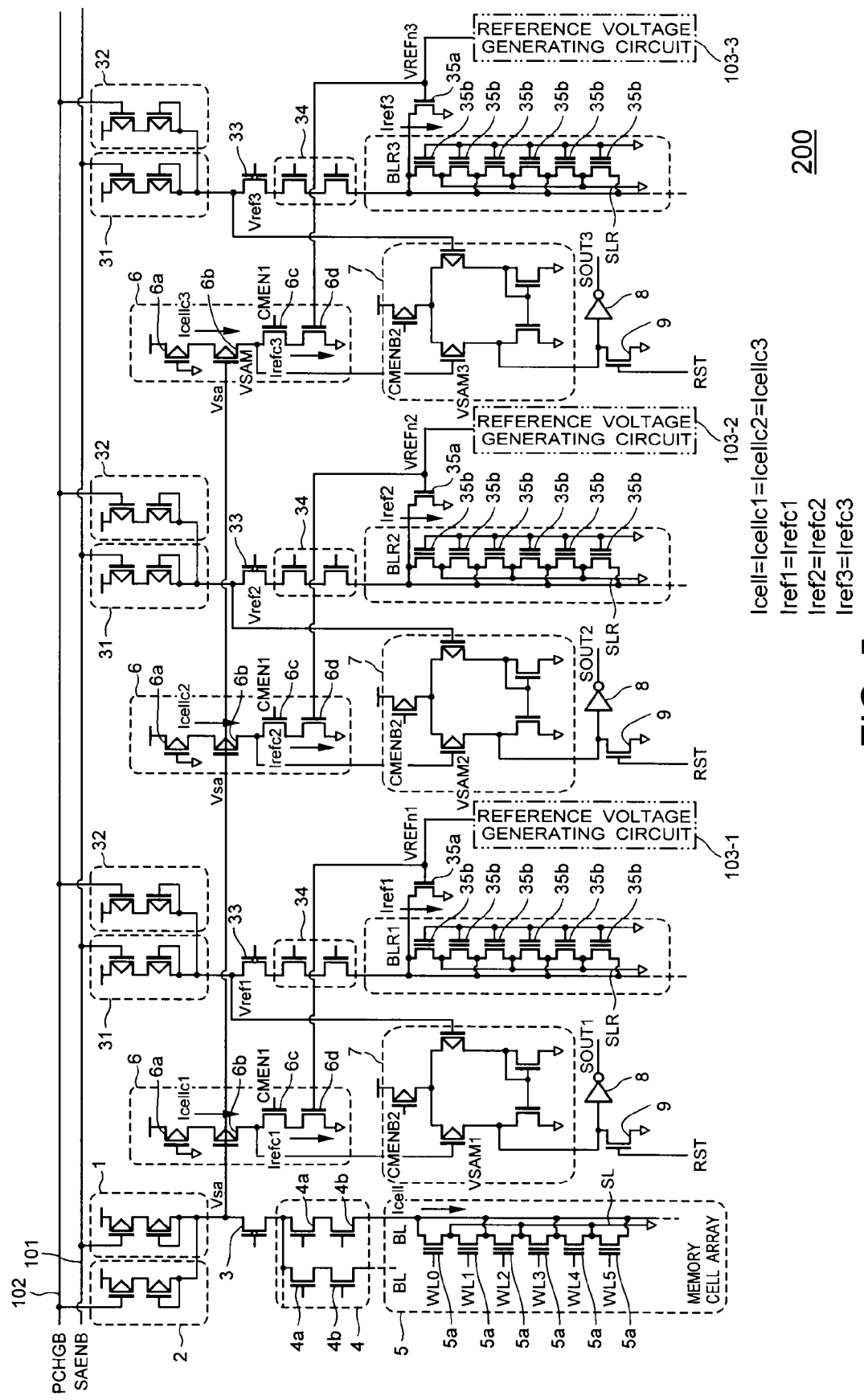
FIG. 5 is a circuit diagram showing an example of the main configuration of a semiconductor memory 200 according to a second embodiment which is an aspect of the present invention.

FIG. 5 is a circuit diagram showing an example of the main configuration of a semiconductor memory 200 according to a second embodiment which is an aspect of the present invention. Configurations indicated by the same reference numerals as the first embodiment are the same configurations as the first embodiment.

As shown in FIG. 5, the semiconductor memory 200 includes a current source 1, an auxiliary current source 2, an nMOS transistor 3, a column gate 4, and a memory cell array 5. As has been discussed, memory cells 5a of the memory cell array 5 have adjustable threshold voltages and can store multivalued data.

As shown in FIG. 5, the semiconductor memory 200 further includes a plurality of (in this case, three) reference voltage generating circuits 103-1 to 103-3. Moreover, the semiconductor memory 200 includes first-stage amplifier circuits 6, differential amplifier circuits 7, inverters 8, and reset circuits 9 for the respective reference voltage generating circuits 103-1 to 103-3. Further, the semiconductor memory 200 includes current sources 31, auxiliary current sources 32, nMOS transistors 33, column gates 34, reference MOS transistors 35a, and dummy cells 35b for the respective reference voltage generating circuits 103-1 to 103-3.

The gates of amplifier input MOS transistors 6b of the first-stage amplifier circuits 6 are connected in common to the other end (drain) of a load MOS transistor 1b. Thus a potential Vsa is applied in common to the gates of the amplifier input MOS transistors 6b. Therefore, the amplifier input MOS transistors 6b are respectively fed with currents Icellc1, Icellc2 and Icellc3 obtained by current mirroring a current Icell. Since the amplifier input MOS transistors 6b have the same size, the currents Icellc1, Icellc2 and Icellc3 are equal to one another.

The reference voltage generating circuits 103-1 to 103-3 are identical in configuration to the reference voltage generating circuit 103 shown in FIG. 3 of the first embodiment. The threshold voltages of reference cells 15a in the reference voltage generating circuits 103-1 to 103-3 are different from one another. In other words, the semiconductor memory 200 includes the plurality of reference cells 15a having different threshold voltages. The semiconductor memory 200 further includes at least load MOS transistors 11b and 21b and reference MOS transistors 25 for the respective reference cells 15a.

The reference voltage generating circuit 103-1 generates a potential VREFn1 according to a current passing through the reference cell 15a. A current Iref1 passes through the reference MOS transistor 35a having the gate fed with the potential VREFn1. The potential VREFn1 is inputted to the gate of an amplifier reference MOS transistor 6d of the first-stage amplifier circuit 6 connected to the reference voltage generating circuit 103-1. Thus the amplifier reference MOS transistor 6d is fed with a current Irefc1. As described in the first embodiment, a current Iref1 and the current Irefc1 are equal to each other.

The reference voltage generating circuit 103-2 similarly generates a potential VREFn2 according to a current passing through the reference cell 15a. A current Iref2 passes through the reference MOS transistor 35a having the gate fed with the potential VREFn2. The potential VREFn2 is inputted to the gate of an amplifier reference MOS transistor 6d of the first-stage amplifier circuit 6 connected to the reference voltage generating circuit 103-2. Thus the amplifier reference MOS transistor 6d is fed with a current Irefc2. As described in the first embodiment, a current Iref2 and the current Irefc2 are equal to each other.

The reference voltage generating circuit 103-3 similarly generates a potential VREFn3 according to a current passing through the reference cell 15a. A current Iref3 passes through the reference MOS transistor 35a having the gate fed with the potential VREFn3. The potential VREFn3 is inputted to the gate of an amplifier reference MOS transistor 6d of the first-stage amplifier circuit 6 connected to the reference voltage generating circuit 103-3. Thus the amplifier reference MOS transistor 6d is fed with a current Irefc3. As described in the first embodiment, a current Iref3 and the current Irefc3 are equal to each other.

As described above, the reference cells 15a of the reference voltage generating circuits 103-1 to 103-3 are set to have different threshold voltages, so that the values of the potentials VREFn1, VREFn2 and VREFn3 are different from one another. Thus the values of the currents Iref1, Iref2 and Iref3 are also different from one another.

The current mirror configurations and so on of the reference voltage generating circuits 103-1 to 103-3 may be adjusted to equalize the potentials VREFn1, VREFn2 and VREFn3. In this case, the reference MOS transistors 35a are differently sized. Thus the currents Iref1, Iref2 and Iref3 passing through the reference MOS transistors 35a have different values.

Figures 6A, 6B:
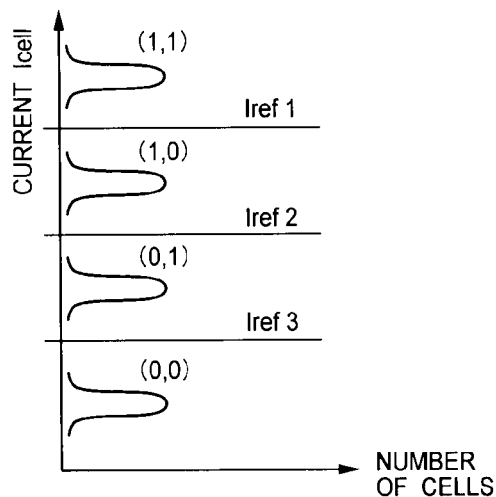
FIG. 6A shows the relationship among the current Icell passing through the multivalued memory cells of FIG. 5, the reference currents Iref1, Iref2 and Iref3, and stored multivalued data.
FIG. 6B shows the relationship between the multivalued data of FIG. 6A and outputs SOUT of the inverters of FIG. 5.

FIG. 6A shows the relationship among the current Icell passing through the multivalued memory cells of FIG. 5, the reference currents Iref1, Iref2 and Iref3, and stored multivalued data. FIG. 6B shows the relationship between the multivalued data of FIG. 6A and outputs SOUT of the inverters of FIG. 5.

As shown in FIGS. 6A and 6B, the logic of the output SOUT of the inverter 8 is determined based on the relationship between the current Icell passing through the memory cells and the currents Iref1, Iref2 and Iref3. According to the logic of the output SOUT, data stored in the memory cells 5a is decided.

Figure 6C:
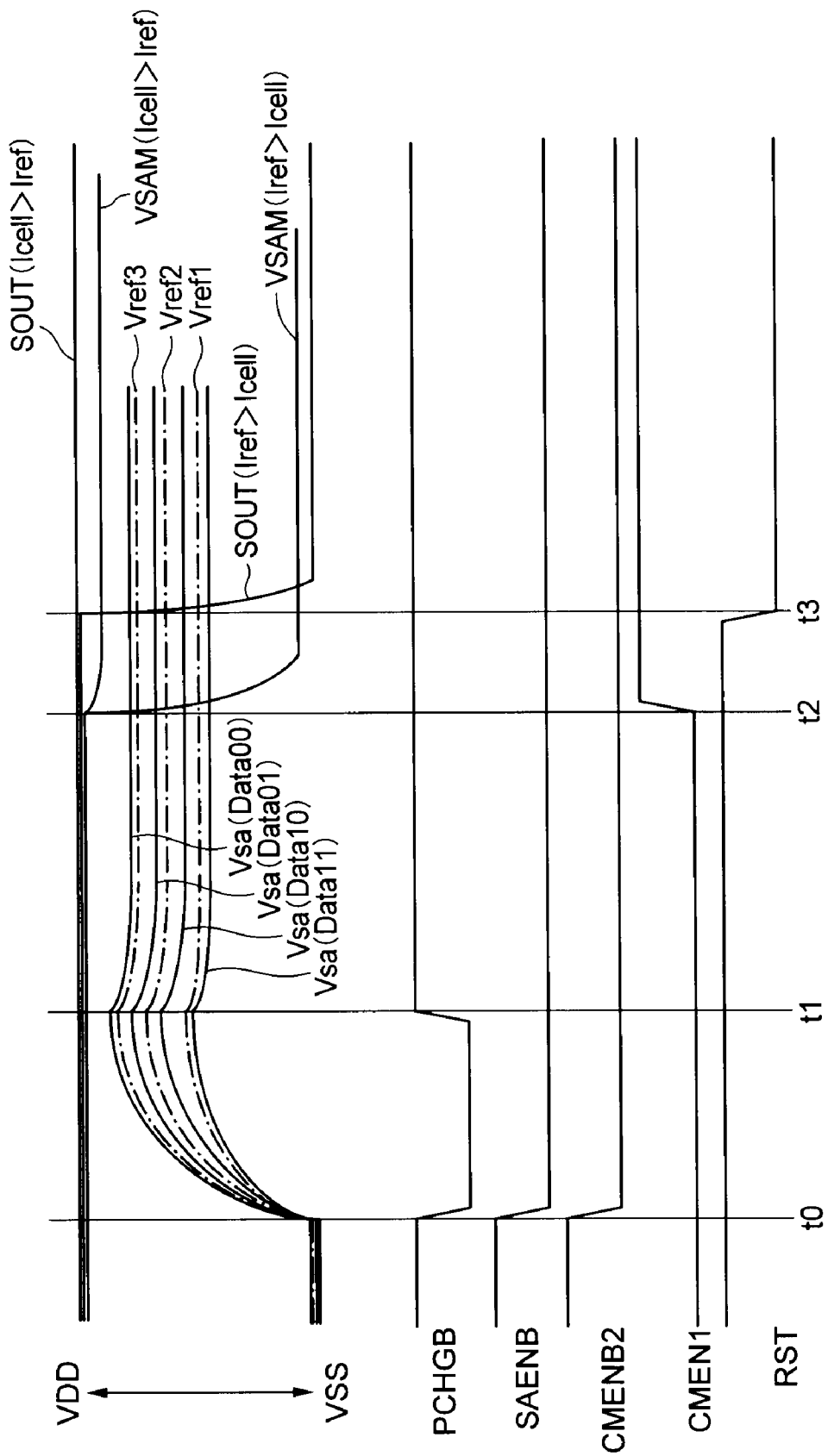
FIG. 6C shows the waveforms of the signals of the semiconductor memory 200 shown in FIG. 5.

FIG. 6C shows the waveforms of the signals of the semiconductor memory 200 shown in FIG. 5. As shown in FIG. 6C, signals PCHGB, SAENB and CMENB2 change from "High" to "Low" at time t0, so that the current sources and the auxiliary current sources are activated and the potential Vsa and potentials Vref1, Vref2 and Vref3 increase.

Next, at time t1, the signal PCHGB becomes "High" and the auxiliary current sources are deactivated. Thus a precharging operation is completed and the current Icell corresponding to data stored in the memory cells 5a is passed.

Next, at time t2, a signal CMEN1 changes from "Low" to "High" and the first-stage amplifier circuits 6 are activated.

As in the first embodiment, the first-stage amplifier circuits 6 have small capacitances and thus potentials VSAM1, VSAM2 and VSAM3 outputted the first-stage amplifier circuits 6 quickly move to operating points obtained by differences between the current Icell and the currents Iref1, Iref2 and Iref3. Thus it is possible to quickly obtain desired differential input potential differences ΔV for the respective differential amplifier circuits 7.

Next, at time t3, a signal RST changes from "High" to "Low", the reset of the reset circuits 9 is canceled, and signals corresponding to the comparison results of the differential amplifier circuits 7 between the potential VSAM1, VSAM2 and VSAM3 and the potentials Vref1, Vref2 and Vref3 are inputted to the inverters 8. Then, the inverters 8 output the inverted signals of the signals as SOUT1, SOUT2 and SOUT3. Multivalued data stored in the memory cells 5a is decided based on the signals SOUT1, SOUT2 and SOUT3.

Also in reading of multivalued data, even when a wiring parasitic capacitance increases with smaller design rules, the decision time of the differential amplifier circuit 7 can be shortened by the sufficiently large differential potential difference ΔV as in the first embodiment.

As described above, the semiconductor memory of the present embodiment can further reduce a reading time.

Third Embodiment

The second embodiment described an example of the configuration in which the potential Vsa is shared by the first-stage amplifier circuits for reading multivalued data. The present embodiment will describe an example of a configuration in which a potential outputted from a reference voltage generating circuit is shared by a plurality of differential amplifier circuits to reduce a circuit area and current consumption.

Figure 7:
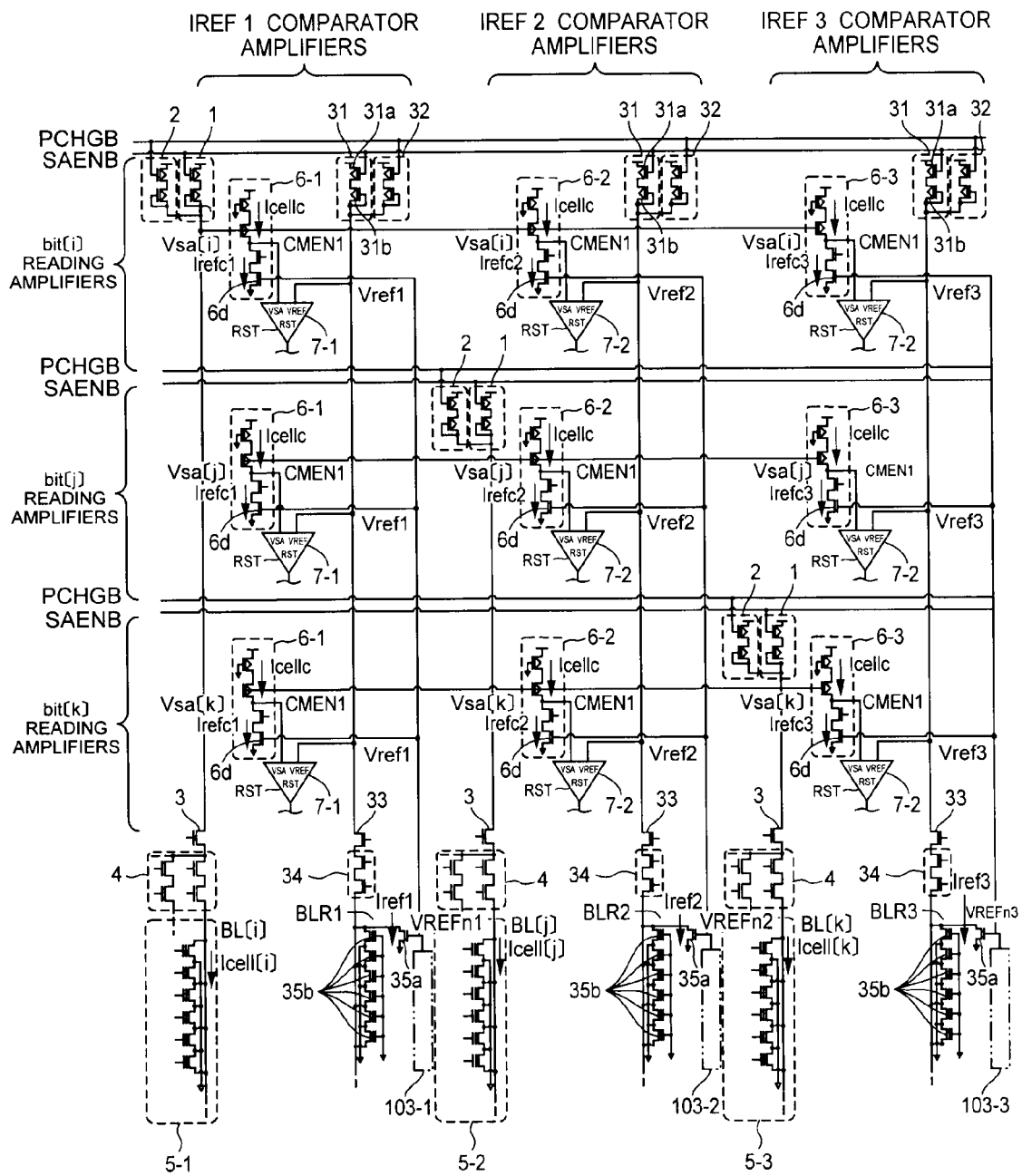
FIG. 7 is a circuit diagram showing an example of the main configuration of a semiconductor memory 300 according to a third embodiment which is an aspect of the present invention.

FIG. 7 is a circuit diagram showing an example of the main configuration of a semiconductor memory 300 according to a third embodiment which is an aspect of the present invention. Configurations indicated by the same reference numerals as the first and second embodiments are the same configurations as the first and second embodiments. In FIG. 7, an inverter 8 and a reset circuit 9 are omitted for simplification.

As shown in FIG. 7, the semiconductor memory 300 includes a plurality of (in this case, three) memory cell arrays 5-1, 5-2 and 5-3. These memory cell arrays 5-1, 5-2 and 5-3 are identical in configuration to the memory cell array 5 of the second embodiment.

As in the second embodiment, the semiconductor memory 300 includes first-stage amplifier circuits 6-1 to 6-3 and differential amplifier circuits 7-1 to 7-3 for the respective memory cell arrays 5-1, 5-2 and 5-3. The first-stage amplifier circuits 6-1 to 6-3 and the differential amplifier circuits 7-1 to 7-3 are identical in configuration to the first-stage amplifier circuit 6 and the differential amplifier circuit 7 of the second embodiment.

The semiconductor memory 300 further includes current sources 31, auxiliary current sources 32, nMOS transistors 33, column gates 34, reference MOS transistors 35a, and dummy cells 35b for respective reference voltage generating circuits 103-1 to 103-3.

As shown in FIG. 7, a potential VREFn1 supplied to each of the first-stage amplifier circuits 6-1 is supplied from the same reference voltage generating circuit 103-1. In other words, the potential (the output potential of the reference voltage generating circuit 103-1) VREFn1 of the gate of a reference MOS transistor 25 of the reference voltage generating circuit 103-1 is applied in common to the gates of amplifier reference MOS transistors 6d of the multiple first-stage amplifier circuits 6-1.

Similarly, a potential VREFn2 supplied to each of the first-stage amplifier circuits 6-2 is supplied from the same reference voltage generating circuit 103-2. In other words, the potential (the output potential of the reference voltage generating circuit 103-2) VREFn2 of the gate of a reference MOS transistor 25 of the reference voltage generating circuit 103-2 is applied in common to the gates of amplifier reference MOS transistors 6d of the multiple first-stage amplifier circuits 6-2.

Similarly, a potential VREFn3 supplied to each of the first-stage amplifier circuits 6-3 is supplied from the same reference voltage generating circuit 103-3. In other words, the potential (the output potential of the reference voltage generating circuit 103-3) VREFn3 of the gate of a reference MOS transistor 25 of the reference voltage generating circuit 103-3 is applied in common to the gates of amplifier reference MOS transistors 6d of the multiple first-stage amplifier circuits 6-3.

As described above, the reference voltage generating circuits 103-1 to 103-3 are shared to supply the potentials VREFn1 to VREFn3.

A potential Vref1 supplied to the differential amplifier circuits 7-1 is supplied from a portion between the same reference MOS transistor 35a connected to the reference voltage generating circuit 103-1 and a load MOS transistor 31b. In other words, the potential Vref1 between the load MOS transistor 31b and the reference MOS transistor 25 is inputted in common to the plurality of differential amplifier circuits 7-1.

A potential Vref2 supplied to the differential amplifier circuits 7-2 is supplied from a portion between the same reference MOS transistor 35a connected to the reference voltage generating circuit 103-2 and a load MOS transistor 31b. In other words, the potential Vref2 between the load MOS transistor 31b and the reference MOS transistor 25 is inputted in common to the plurality of differential amplifier circuits 7-2.

A potential Vref3 supplied to the differential amplifier circuits 7-3 is supplied from a portion between the same reference MOS transistor 35a connected to the reference voltage generating circuit 103-3 and a load MOS transistor 31b. In other words, the potential Vref3 between the load MOS transistor 31b and the reference MOS transistor 25 is inputted in common to the plurality of differential amplifier circuits 7-3.

As described above, the reference voltage generating circuits 103-1 to 103-3 are shared to supply the potentials Vref1 to Vref3. In other words, it is possible to reduce the circuit area and current consumption of the semiconductor memory 300.

The operations of the semiconductor memory 300 configured thus are similar to the operations of the semiconductor memory described in the second embodiment.

As described above, the semiconductor memory of the present embodiment can reduce the circuit area and current consumption. Further, it is possible to further reduce a reading time as in the first embodiment.

Fourth Embodiment

The first embodiment described an example of the configuration for reading data stored in the memory cells. The present embodiment will particularly describe an example of a configuration for operating a first-stage amplifier circuit before the completion of a precharging operation performed by an auxiliary current source.

Figure 8:
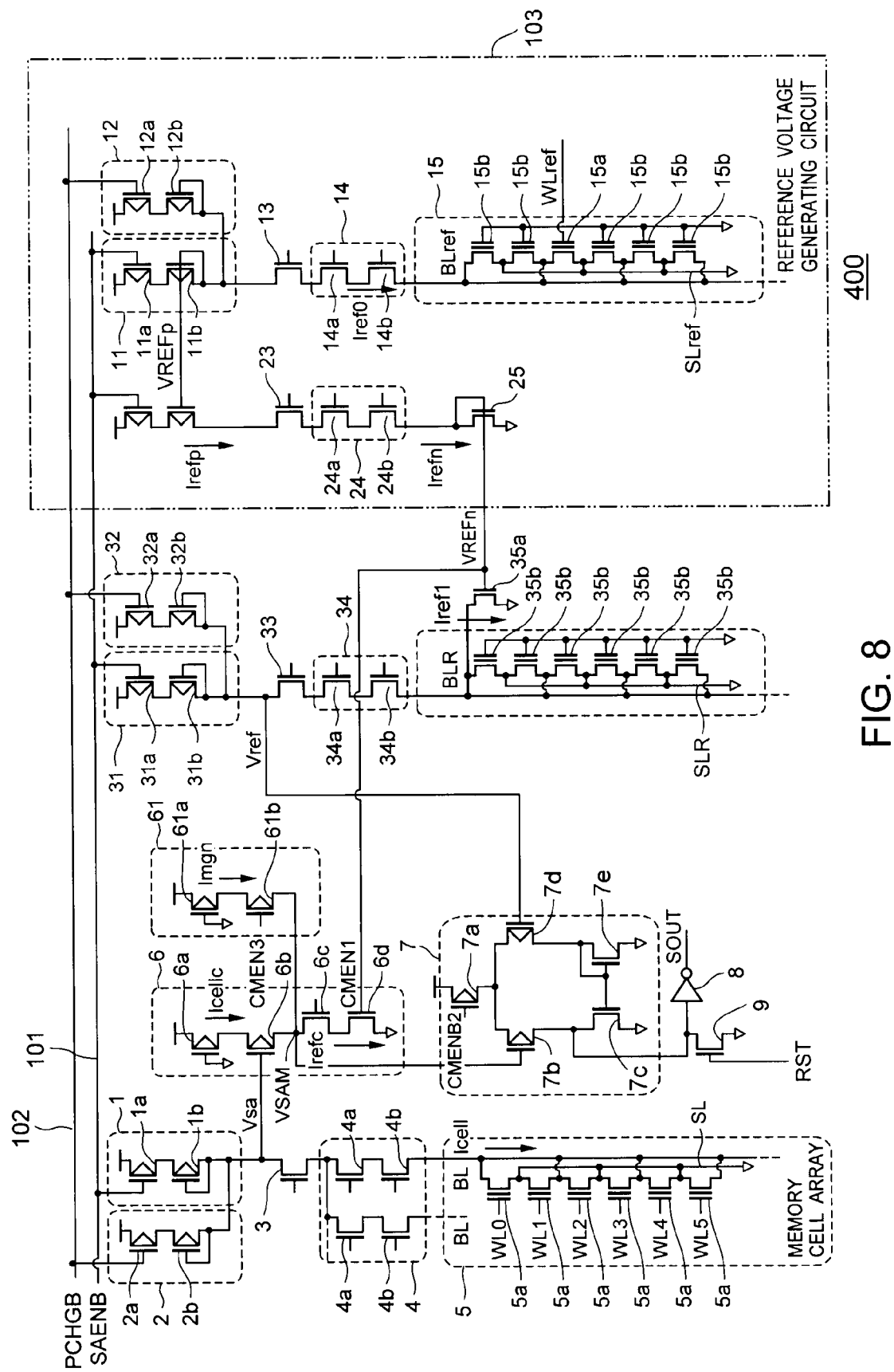
FIG. 8 is a circuit diagram showing an example of the main configuration of a semiconductor memory 400 according to a fourth embodiment which is an aspect of the present invention.

FIG. 8 is a circuit diagram showing an example of the main configuration of a semiconductor memory 400 according to a fourth embodiment which is an aspect of the present invention. Configurations indicated by the same reference numerals as the first embodiment are the same configurations as the first embodiment.

As shown in FIG. 8, the semiconductor memory 400 includes a reset current source 61, unlike the first embodiment. Other configurations are the same as the first embodiment. The reset current source 61 includes a PMOS transistor 61a and a reset MOS transistor 61b which are connected in series between a power supply and the drain of an amplifier reference MOS transistor 6d. The pMOS transistor 61a has the gate connected to the ground.

The reset MOS transistor 61b has the gate fed with a signal CMEN3. The reset MOS transistor 61b is turned on in response to the signal CMEN3 and passes a current Imgn. Thus when a first-stage amplifier circuit 6 is started, a potential VSAM is set higher than a potential Vref.

Figure 9:
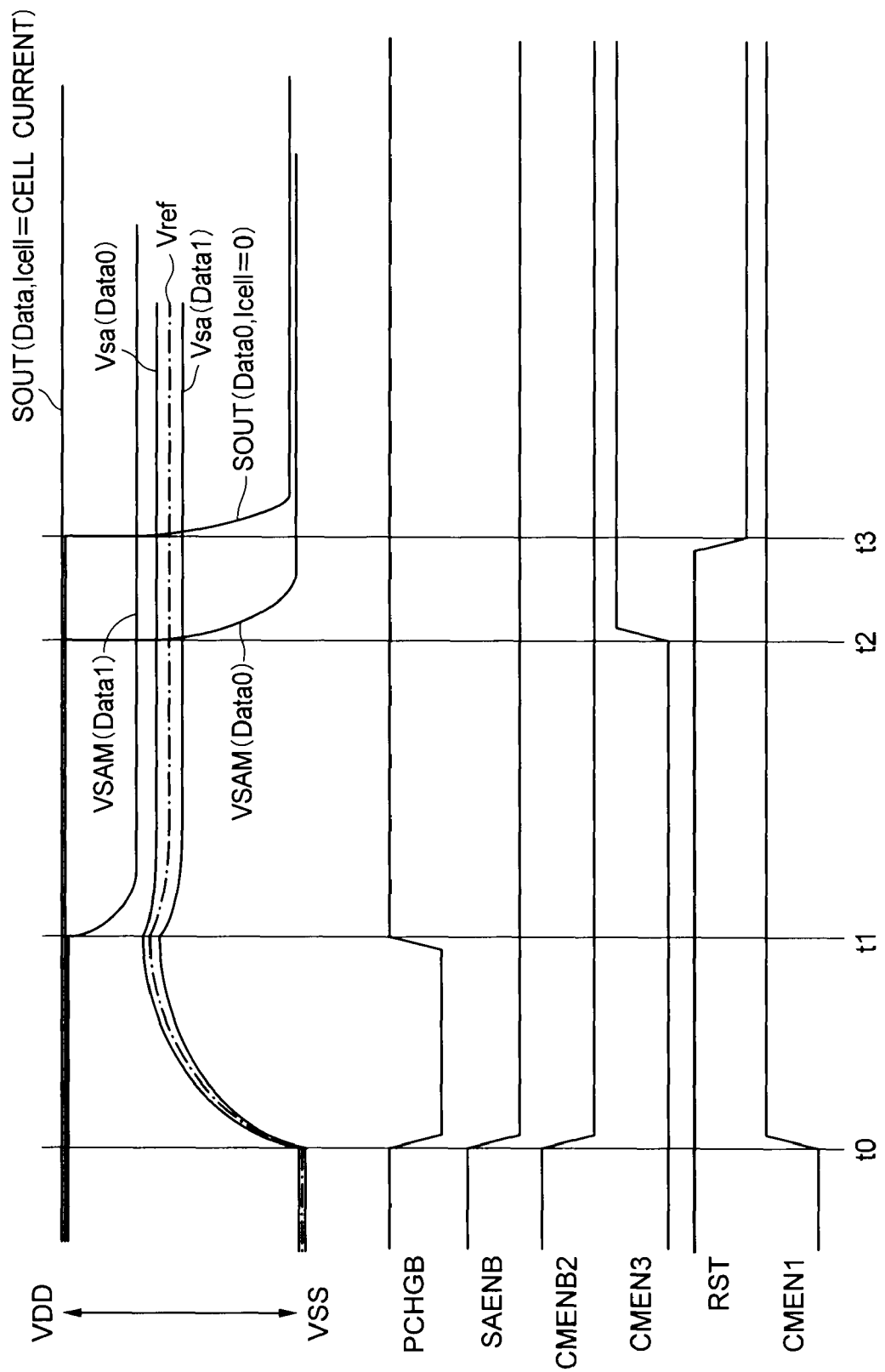
FIG. 9 shows the waveforms of the signals of the semiconductor memory 400 shown in FIG. 8.

FIG. 9 shows the waveforms of the signals of the semiconductor memory 400 shown in FIG. 8. As shown in FIG. 9, at time t0, signals PCHGB, SAENB and CMENB2 change from "High" to "Low", so that current sources 1, 11, 21 and 31 and auxiliary current sources 2, 12 and 32 are activated and potentials Vsa and Vref increase.

Further, a signal CMEN1 changes from "Low" to "High" and the first-stage amplifier circuit 6 is activated. Thus the first-stage amplifier circuit 6 is more quickly activated than in the first embodiment.

Next, at time t1, the signal PCHGB becomes "High" and the auxiliary current sources are deactivated. Thus a precharging operation is completed and then discharging is started.

Since the signal CMEN3 is "Low", the reset MOS transistor 61b is turned on and passes the current Imgn. Thus the potential VSAM which is the output of the first-stage amplifier circuit 6 is kept higher than the potential Vref, so that the potential Vsa is kept and stabilized at a certain value. In other words, the output of the first-stage amplifier circuit 6 is stabilized.

Next, at time t2, the signal CMEN3 changes from "Low" to "High" and the reset MOS transistor 61b is turned off. Thus the potential VSAM which is the output of the first-stage amplifier circuit 6 changes with data (a set threshold voltage) stored in memory cells.

As in the first embodiment, the first-stage amplifier circuit 6 has a small capacitance and thus the potential VSAM which is the output of the first-stage amplifier circuit 6 quickly moves to an operating point obtained by a difference between a current Icell and a current Iref. Thus it is possible to quickly obtain a desired differential input potential difference ΔV for a differential amplifier circuit 7.

Next, at time t3, a signal RST changes from "High" to "Low", the reset of a reset circuit 9 is canceled, and a signal corresponding to the comparison result of the differential amplifier circuit 7 between the potential VSAM and the potential Vref is inputted to an inverter 8. Then, the inverter 8 outputs the inverted signal of the signal as SOUT. Multivalued data stored in memory cells 5a is decided based on signals SOUT.

Also in reading of multivalued data, even when a wiring parasitic capacitance increases with smaller design rules, the decision time of the differential amplifier circuit 7 can be shortened by the sufficiently large differential potential difference ΔV as in the first embodiment.

As described above, the potential VSAM outputted from the first-stage amplifier circuit is kept at least at the potential Vref after the completion of the precharging operation. Thus it is possible to suppress the output of pseudo data from the differential amplifier circuit 7.

As described above, the semiconductor memory of the present embodiment can more correctly perform a reading operation. Further, it is possible to further reduce a reading time as in the first embodiment.

Fifth Embodiment

The first embodiment described an example of the configuration for reading data stored in the memory cells. The present embodiment will particularly describe an example of a configuration for reducing the influence of noise caused by the start of a first-stage amplifier circuit 6.

Figure 10:
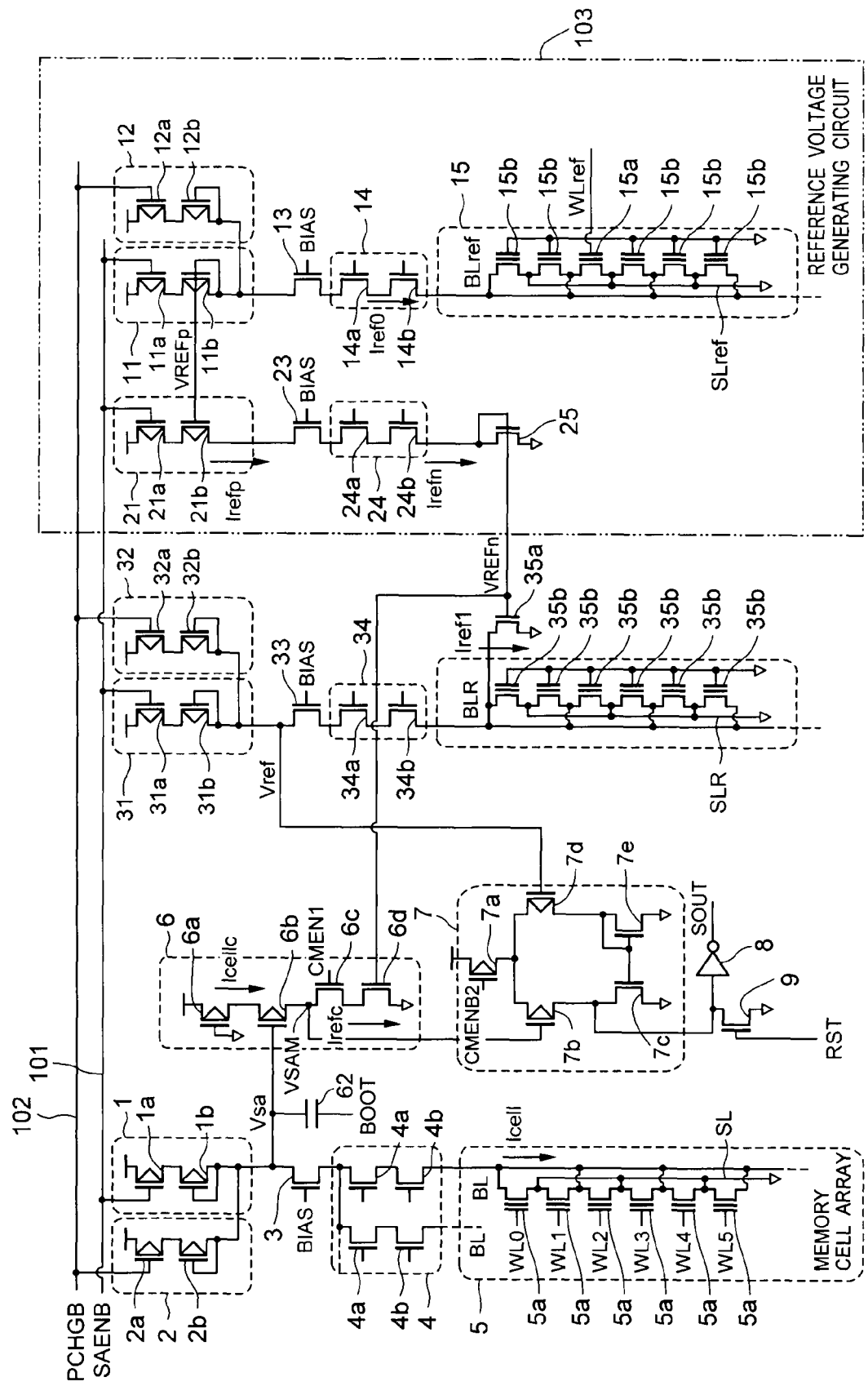
FIG. 10 is a circuit diagram showing an example of the main configuration of a semiconductor memory 500 according to a fifth embodiment which is an aspect of the present invention.

FIG. 10 is a circuit diagram showing an example of the main configuration of a semiconductor memory 500 according to a fifth embodiment which is an aspect of the present invention. Configurations indicated by the same reference numerals as the first embodiment are the same configurations as the first embodiment.

As shown in FIG. 10, the semiconductor memory 500 further includes a boot capacitor 62 having one end connected to the gate of an amplifier input MOS transistor 6b, unlike the first embodiment. Other configurations are the same as the first embodiment.

The other end of the boot capacitor 62 is fed with a potential BOOT. By boosting the potential BOOT, a potential (that is, a potential Vsa) on one end of the boot capacitor 62 is boosted.

Figure 11:
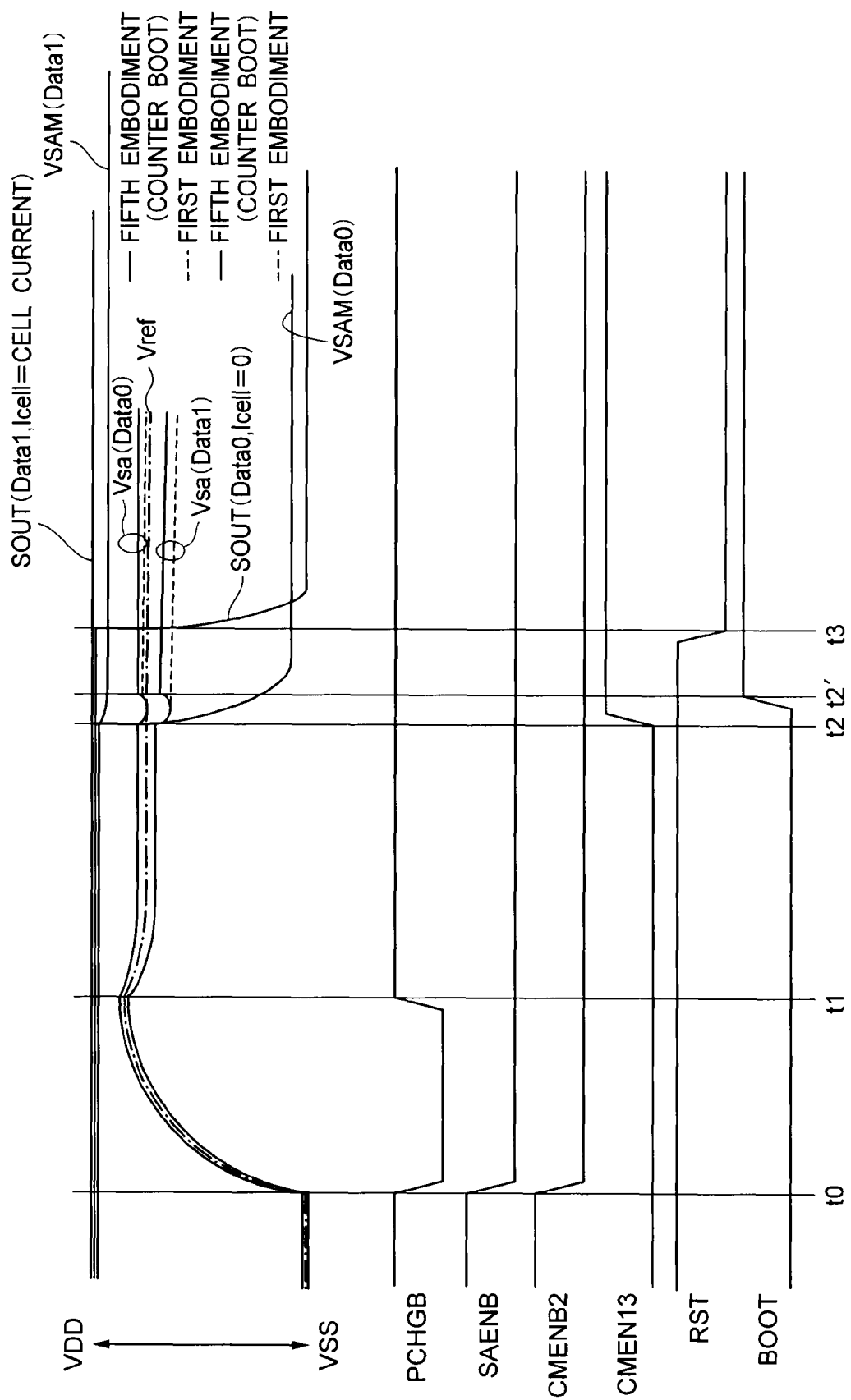
FIG. 11 shows the waveforms of the signals of the semiconductor memory 500 shown in FIG. 10.

FIG. 11 shows the waveforms of the signals of the semiconductor memory 500 shown in FIG. 10. As shown in FIG. 11, at time t0, signals PCHGB, SAENB and CMENB2 change from "High" to "Low", so that current sources and auxiliary current sources are activated and potentials Vsa and Vref increase.

At time t1, the signal PCHGB becomes "High" and the auxiliary current sources are deactivated.

Next, at time t2, a signal CMEN1 changes from "Low" to "High" and an nMOS transistor 6c is turned on to pass currents Icellc and Irefc, so that the first-stage amplifier circuit 6 is started. In other words, the first-stage amplifier circuit 6 is activated.

In the configuration of the first embodiment, by starting the first-stage amplifier circuit 6, noise is superimposed on the potential Vsa through the gate capacitance of the amplifier input MOS transistor 6b of the first-stage amplifier circuit 6, thereby reducing the potential.

In the fifth embodiment, at time t2', the potential BOOT on the other end of the boot capacitor 62 is boosted at the start of the first-stage amplifier circuit 6, so that the potential (that is, the potential Vsa) of one end of the boot capacitor 62 is boosted. Thus the potential Vsa is adjusted to a desired value and the influence of noise is reduced at the start of the first-stage amplifier circuit 6.

As in the first embodiment, the first-stage amplifier circuit 6 has a small capacitance and thus an output signal VSAM from the first-stage amplifier circuit 6 quickly moves to an operating point obtained by a difference between the current Icell and the current Iref. Thus it is possible to quickly obtain a desired differential input potential difference ΔV for a differential amplifier circuit 7.

Next, at time t3, a signal RST changes from "High" to "Low", the reset of a reset circuit 9 is canceled, and a signal corresponding to the comparison result of the differential amplifier circuit 7 between the potential VSAM and the potential Vref is inputted to an inverter 8. Then, the inverter 8 outputs the inverted signal of the signal as SOUT. Multivalued data stored in memory cells 5a is decided based on the signal SOUT.

As described above, the semiconductor memory of the present embodiment can reduce the influence of noise at the start of the first-stage amplifier circuit 6. Further, it is possible to further reduce a reading time as in the first embodiment.

Sixth Embodiment

The fifth embodiment described an example of the configuration for reducing the influence of noise at the start of the first-stage amplifier circuit 6. The present embodiment will describe another example of the configuration for reducing the influence of noise at the start of the first-stage amplifier circuit 6.

Figure 12:
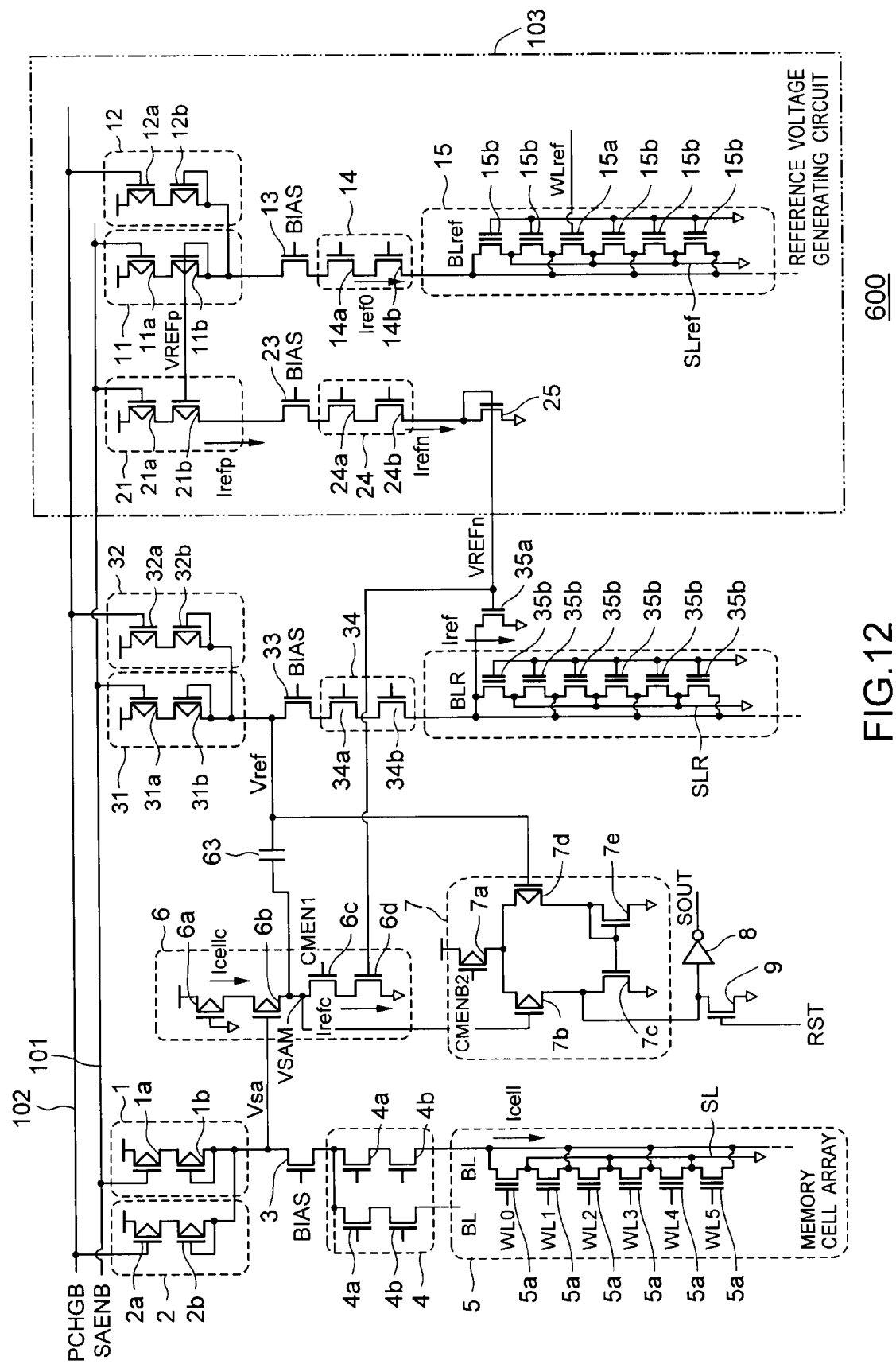
FIG. 12 is a circuit diagram showing an example of the main configuration of a semiconductor memory 600 according to a sixth embodiment which is an aspect of the present embodiment.

FIG. 12 is a circuit diagram showing an example of the main configuration of a semiconductor memory 600 according to a sixth embodiment which is an aspect of the present embodiment. Configurations indicated by the same reference numerals as the first embodiment are the same configurations as the first embodiment.

As shown in FIG. 12, the semiconductor memory 600 includes a capacitor 63 having one end connected to the other end (drain) of an amplifier input MOS transistor 6b and the other end connected to the other end (drain) of a load MOS transistor 31b, unlike the first embodiment. Other configurations are the same as the first embodiment.

Figure 13:
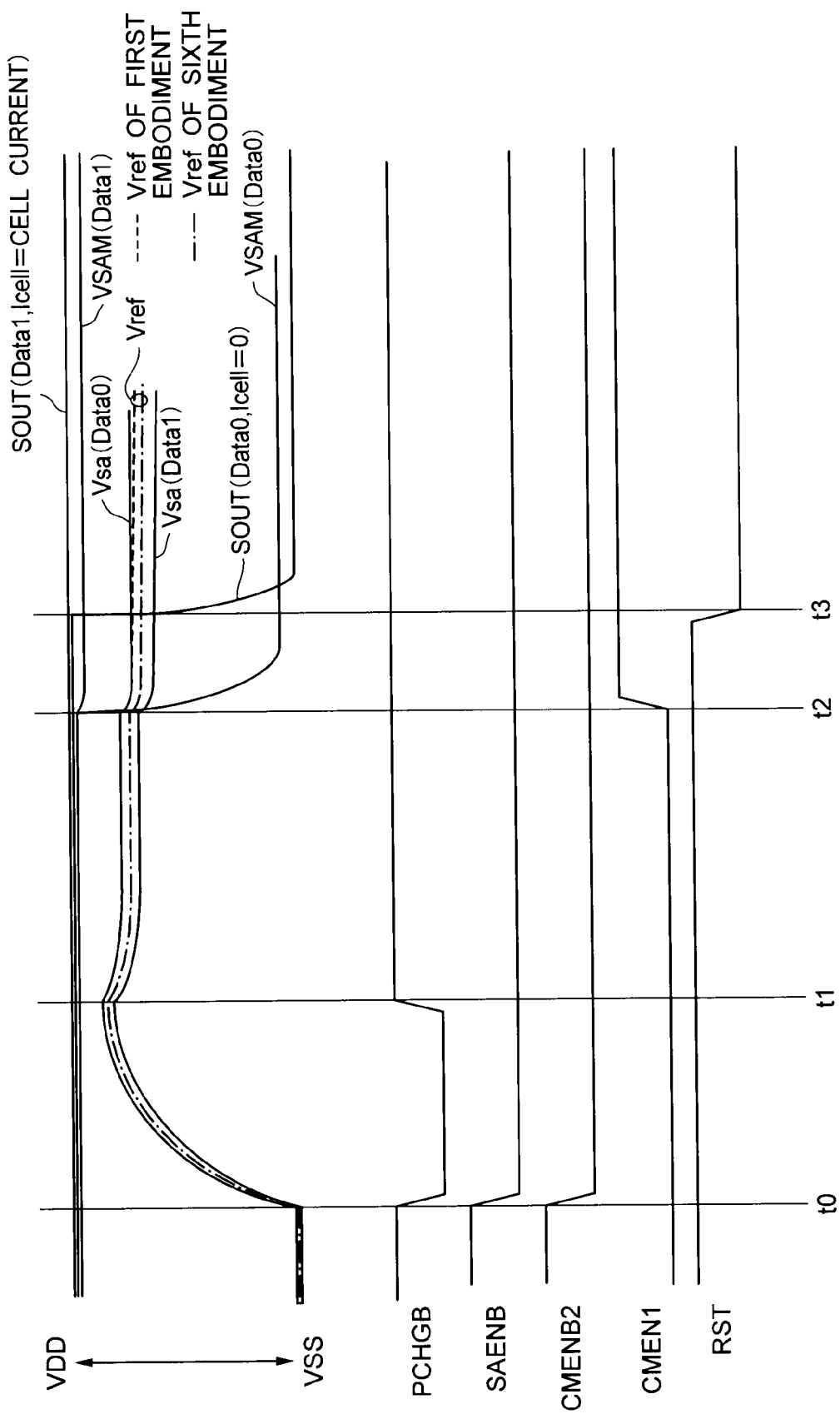
FIG. 13 shows the waveforms of the signals of the semiconductor memory 600 shown in FIG. 12.

FIG. 13 shows the waveforms of the signals of the semiconductor memory 600 shown in FIG. 12.

As shown in FIG. 13, at time t0, signals PCHGB, SAENB and CMENB2 change from "High" to "Low", so that current sources and auxiliary current sources are activated and potentials Vsa and Vref increase.

Next, at time t1, the signal PCHGB becomes "High" and the auxiliary current sources are deactivated.

Next, at time t2, a signal CMEN1 changes from "Low" to "High" and an nMOS transistor 6c is turned on to pass currents Icellc and Irefc, so that the first-stage amplifier circuit 6 is started. In other words, the first-stage amplifier circuit 6 is activated.

As described in the fifth embodiment, at the start of the first-stage amplifier circuit 6, noise is superimposed on the potential Vsa through the gate capacitance of the amplifier input MOS transistor 6b of the first-stage amplifier circuit 6, thereby reducing the potential.

In the sixth embodiment, since the capacitive element 63 is provided, the potential Vref is reduced as the potential Vsa decreases. In other words, the phases of noise applied to the potential Vsa and the potential Vref are matched with each other, thereby compensating for the influence of noise. Thus it is possible to stably operate a differential amplifier circuit 7.

As in the first embodiment, the first-stage amplifier circuit 6 has a small capacitance and thus an output signal VSAM from the first-stage amplifier circuit 6 quickly moves to an operating point obtained by a difference between a current Icell and a current Iref. Thus it is possible to quickly obtain a desired differential input potential difference ΔV for the differential amplifier circuit 7.

Next, at time t3, a signal RST changes from "High" to "Low", the reset of a reset circuit 9 is canceled, and a signal corresponding to the comparison result of the differential amplifier circuit 7 between the potential VSAM and the potential Vref is inputted to an inverter 8. Then, the inverter 8 outputs the inverted signal of the signal as SOUT. Multivalued data stored in memory cells 5a is decided based on the signal SOUT.

As described above, the semiconductor memory of the present embodiment can reduce the influence of noise at the start of the first-stage amplifier circuit 6. Further, it is possible to further reduce a reading time as in the first embodiment.

Seventh Embodiment

In the foregoing embodiments, the potential VSAM and the potential Vref are compared with each other by the differential amplifier circuit, and then a signal corresponding to the comparison result is outputted through the inverter as the signal SOUT for deciding data.

When the potential VSAM has a sufficient amplitude for deciding correlation with data stored in memory cells, the signal SOUT may be outputted based on the potential VSAM. The present embodiment will describe an example of a configuration in which the differential amplifier circuit is omitted.

Figure 14:
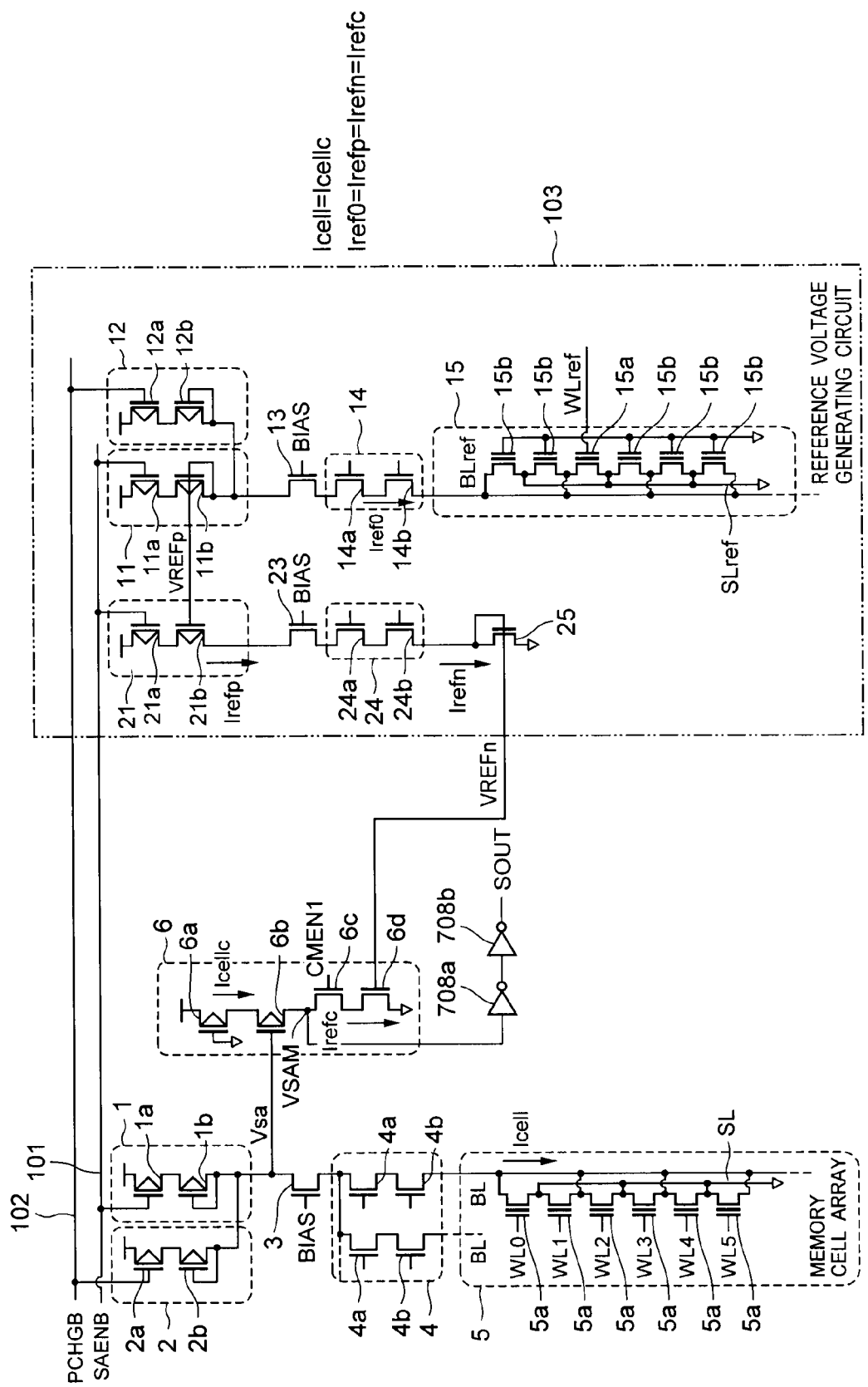
FIG. 14 is a circuit diagram showing an example of the main configuration of a semiconductor memory 700 according to a seventh embodiment which is an aspect of the present invention.

FIG. 14 is a circuit diagram showing an example of the main configuration of a semiconductor memory 700 according to a seventh embodiment which is an aspect of the present invention. Configurations indicated by the same reference numerals as the first embodiment are the same configurations as the first embodiment.

As shown in FIG. 14, unlike the first embodiment, the semiconductor memory 700 includes an inverter 708a which has the input connected to the output of a first-stage amplifier circuit 6 (between an amplifier input MOS transistor 6b and an amplifier reference MOS transistor 6d) and an inverter 708b which has the input connected to the output of the inverter 708a and outputs a signal SOUT.

Unlike the first embodiment, this configuration can eliminate the need for a differential amplifier circuit 7, an inverter 8, a reset circuit 9, and a configuration for supplying a potential Vref to the differential amplifier circuit 7. Other configurations are the same as the first embodiment.

Thus the semiconductor memory 700 outputs the signal SOUT for reading data stored in memory cells, based on a potential VSAM (a potential between the amplifier input MOS transistor 6b and the amplifier reference MOS transistor 6d) which is the output of the first-stage amplifier circuit 6.

With this configuration, the semiconductor memory 700 can simplify the circuit and increase the speed of the circuit as compared with the first embodiment. As in the first embodiment, the first-stage amplifier circuit 6 has a small capacitance and thus an output signal VSAM from the first-stage amplifier circuit 6 quickly moves to an operating point obtained by a difference between a current Icell and a current Iref. Thus it is possible to quickly obtain a desired differential input potential difference ΔV for the differential amplifier circuit 7.

As described above, the semiconductor memory of the present embodiment can simplify the circuit and increase the speed of the circuit. Further, it is possible to further reduce a reading time as in the first embodiment.

Eighth Embodiment

In the first embodiment, the potential VSAM and the potential Vref are compared with each other by the differential amplifier circuit, and then a signal corresponding to the comparison is outputted through the inverter as the signal SOUT for deciding data. However, current is consumed in the circuit for generating the potential Vref. The potential Vref is preferably placed at the center of the amplitude of the potential VSAM.

The present embodiment will describe an example of a configuration for inputting a fixed potential to a differential amplifier circuit 7 instead of the potential Vref.

Figure 15:
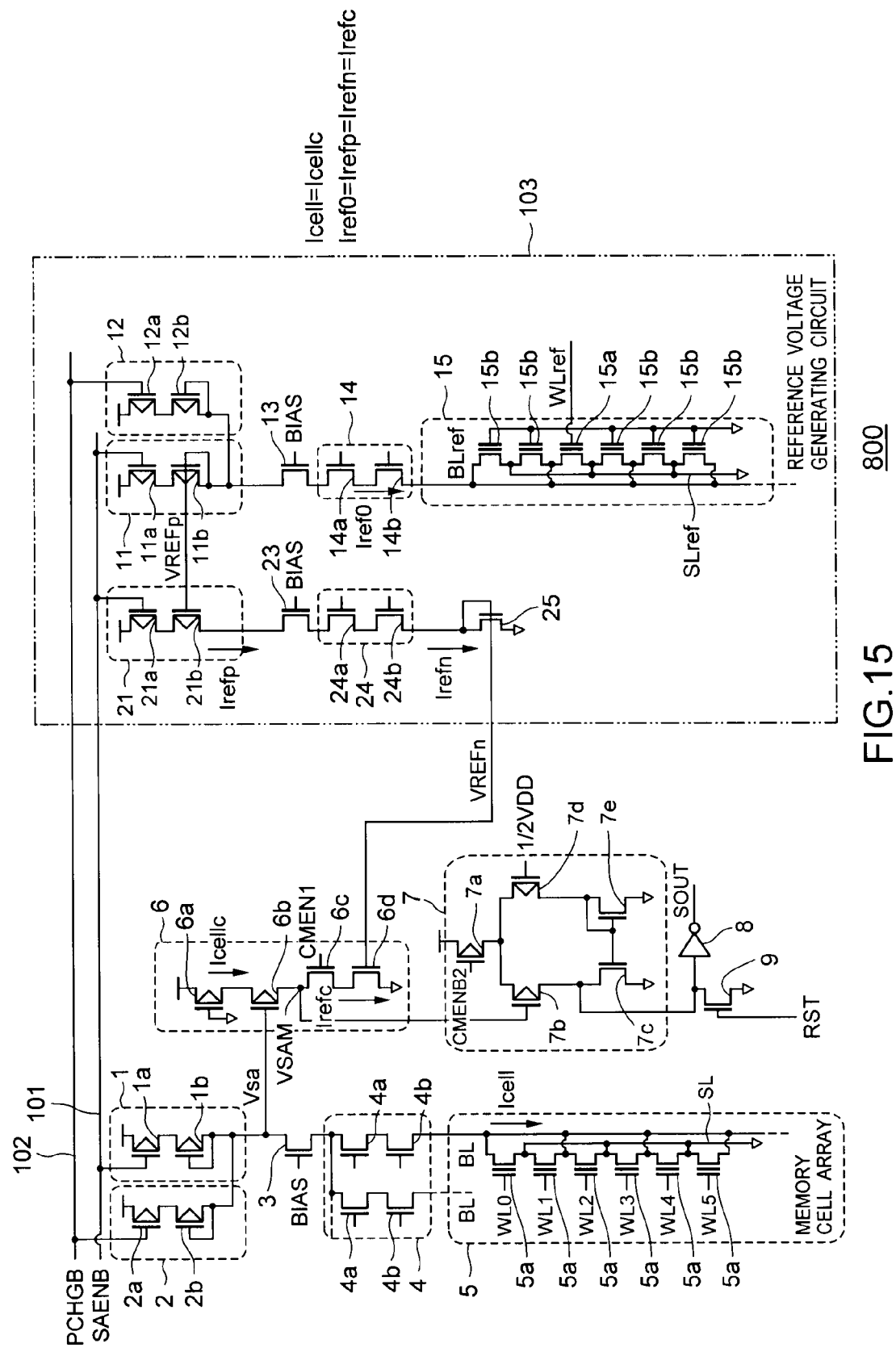
FIG. 15 is a circuit diagram showing an example of the main configuration of a semiconductor memory 800 according to an eighth embodiment which is an aspect of the present invention.

FIG. 15 is a circuit diagram showing an example of the main configuration of a semiconductor memory 800 according to an eighth embodiment which is an aspect of the present invention. Configurations indicated by the same reference numerals are the same configurations as the first embodiment.

As shown in FIG. 15, the differential amplifier circuit 7 of the semiconductor memory 800 is fed with a potential VSAM which is the output of a first-stage amplifier circuit 6 and is obtained between an amplifier input MOS transistor 6b and an amplifier reference MOS transistor 6d and is fed with a fixed potential (½)×VDD between a power supply potential VDD and a ground potential VSS. Unlike the first embodiment, a configuration for supplying the potential Vref to the differential amplifier circuit 7 is not necessary. Other configurations are the same as the first embodiment.

The differential amplifier circuit 7 compares the potential VSAM and the fixed potential (½)×VDD and outputs a signal corresponding to the comparison result.

An inverter 8 outputs a signal having a phase inverted from the signal, as SOUT.

Thus the semiconductor memory 800 can simplify the circuit and reduce current consumption as compared with the first embodiment.

As in the first embodiment, the first-stage amplifier circuit 6 has a small capacitance and thus an output signal VSAM of the first-stage amplifier circuit 6 quickly moves to an operating point obtained by a difference between a current Icell and a current Iref. Thus it is possible to quickly obtain a desired differential input potential difference ΔV for the differential amplifier circuit 7.

As described above, the semiconductor memory of the present embodiment can simplify the circuit and reduce current consumption. Further, it is possible to further reduce a reading time as in the first embodiment.

The foregoing embodiments are applicable not only to a NOR flash memory but also to various semiconductor memories such as a NAND flash memory.

(Application)

The following will describe an example in which the semiconductor memory (NOR flash memory) 100 having the foregoing configuration and functions is mounted in a semiconductor chip. The same explanation is applicable to the semiconductor memories 200, 300, 400, 500, 600, 700 and 800 described in the foregoing embodiments.

Figure 16:
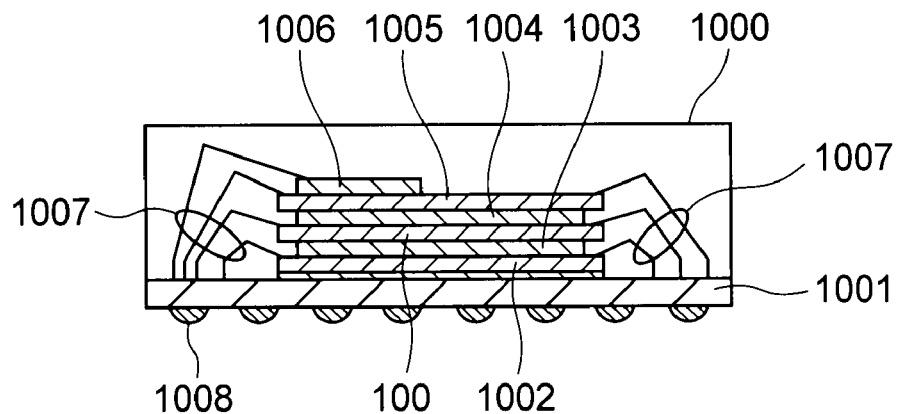
FIG. 16 is a sectional view showing an example of a semiconductor chip (Multi Chip Package (MCP)) 1000 including the semiconductor memory according to the first embodiment which is an aspect of the present invention, for example, the NOR flash memory 100.

FIG. 16 is a sectional view showing an example of a semiconductor chip (Multi Chip Package (MCP)) 1000 including the semiconductor memory according to the first embodiment which is an aspect of the present invention, for example, the NOR flash memory 100.

As shown in FIG. 16, the semiconductor chip 1000 includes, in the same package, a NAND flash memory 1002, a spacer 1003, the NOR flash memory 100, a spacer 1004, a pseudo static random access memory (PSRAM) 1005, and a controller 1006 which are sequentially stacked on a substrate 1001.

The NAND flash memory 1002 has, for example, a plurality of memory cells capable of storing multivalued data. The semiconductor chip 1000 may include a synchronous dynamic random access memory (SDRAM) instead of the PSRAM.

Of these memories, the NAND flash memory 1002 is used as, for example, a data storing memory according to a use of a memory system. The NOR flash memory 100 is used as, for example, a program storing memory. The PSRAM 1005 is used as, for example, a work memory.

The controller 1006 mainly controls the input and output of data and manages data for the NAND flash memory 1002. The controller 1006 has an ECC correcting circuit (not shown) which adds an error correction code (ECC) when data is written, and analyzes and processes the error correction code during reading.

The NAND flash memory 1002, the NOR flash memory 100, PSRAM 1005, and the controller 1006 are bonded to the substrate 1001 with wires 107.

Solder balls 1008 provided on the underside of the substrate 1001 are electrically connected to the wires 1007. As a package shape, for example, a surface-mounting ball grid array (BGA) is used which is a two-dimensional arrangement of the solder balls 1008.

The following will describe the case where the semiconductor chip 100 is applied to a mobile phone which is an example of electronic equipment.

Figure 17:
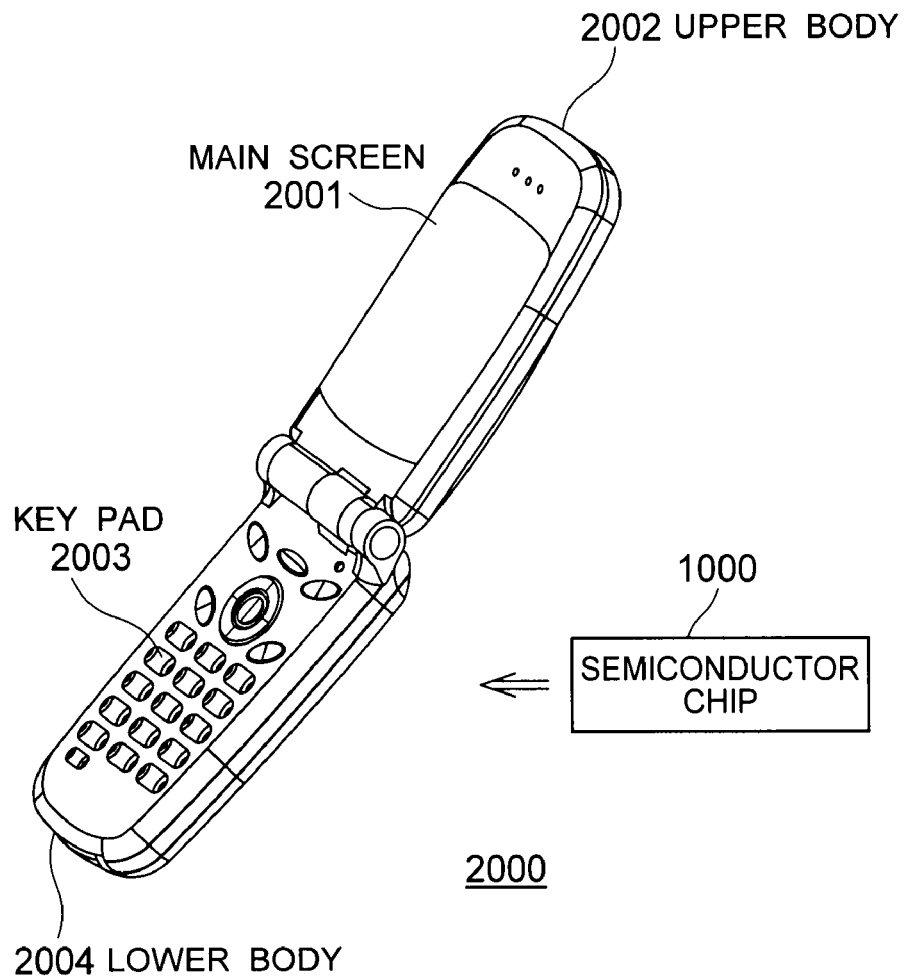
FIG. 17 shows the mobile phone having the semiconductor chip 1000 mounted therein.

FIG. 17 shows the mobile phone having the semiconductor chip 1000 mounted therein. As shown in FIG. 17, a mobile phone 2000 includes an upper body 2002 having a main screen 2001 and a lower body 2004 having key pads 2003. The semiconductor chip 1000 is mounted in the mobile phone 2000.

A CPU (not shown) mounted in the mobile phone 2000 accesses the semiconductor chip 1000 via an interface (not shown) and transfers data and so on. For example, the mobile phone 2000 uses the NAND flash memory 1002 as a storage region of user data and the NOR flash memory 100 as a program storage region of firmware and so on.

In such a memory system, the NOR flash memory 100 is demanded of a shorter reading time of data. Further, the amount of program data to be stored has increased with the functionality of application software.

According to the NOR flash memory 100 according to the first embodiment which is an aspect of the present invention, as described above, even when, for example, stored data is multivalued to increase the storage capacity, it is possible to read data at high speed without sacrificing a reading time.

The semiconductor chip 1000 is applicable to electronic equipment such as a personal computer, a digital still camera, and a PDA as well as the above mobile phone.

What is claimed is:
1. A semiconductor memory, comprising:
a first load MOS transistor of a first conductivity type which has one end connected to a power supply and is diode-connected;
nonvolatile memory cells which are connected between an other end of the first load MOS transistor and ground and have adjustable threshold voltages;

a second load MOS transistor of the first conductivity type which has one end connected to the power supply, is diode-connected, and has the same size as the first load MOS transistor;

nonvolatile reference cells which are connected between an other end of the second load MOS transistor and the ground and have adjustable threshold voltages;

a third load MOS transistor of the first conductivity type which has one end connected to the power supply, has a gate connected to a gate of the second load MOS transistor, has the same size as the first load MOS transistor, and is fed with a current obtained by current mirroring a current passing through the second load MOS transistor;

a first reference MOS transistor of a second conductivity type which is connected between an other end of the third load MOS transistor and the ground and is diode-connected;

an amplifier input MOS transistor of the first conductivity type which has one end connected to the power supply, has a gate connected to the other end of the first load MOS transistor, has the same size as the first load MOS transistor, and composes a first-stage amplifier circuit; and an amplifier reference MOS transistor of the second conductivity type which is connected between an other end of the amplifier input MOS transistor and the ground, has the same size as the first reference MOS transistor, is fed with a current obtained by current mirroring a current passing through the first reference MOS transistor, and composes the first-stage amplifier circuit, wherein data stored in the memory cells is read based on a potential between the amplifier input MOS transistor and the amplifier reference MOS transistor, the potential being outputted from the first-stage amplifier circuit.

2. The semiconductor memory according to claim 1, wherein the semiconductor memory comprises the plurality of nonvolatile reference cells having different threshold voltages, the semiconductor memory comprises the plurality of second load MOS transistors, third load MOS transistors, first reference MOS transistors, and first-stage amplifier circuits for the respective nonvolatile reference cells, and the amplifier reference MOS transistors of the first-stage amplifier circuits have gates connected in common to the other end of the first load MOS transistor.

3. The semiconductor memory according to claim 2, further comprising a boot capacitor having one end connected to the gate of the amplifier input MOS transistor, wherein a potential on an other end of the boot capacitor is boosted when the first-stage amplifier circuit is started.

4. The semiconductor memory according to claim 2, wherein the semiconductor memory is a NOR flash memory.

5. The semiconductor memory according to claim 2, wherein the nonvolatile memory cell can store multivalued data.

6. The semiconductor memory according to claim 5, wherein the multivalued data stored in the nonvolatile memory cell is decided according to logics determined based on the relationship between a current passing through the memory cell and currents passing through the nonvolatile reference cells.

7. The semiconductor memory according to claim 6, wherein the current passing through the memory cell and the currents passing through the nonvolatile reference cells are pass at the same time, and the relationship is derived at the same time.

8. The semiconductor memory according to claim 1, further comprising:

a fourth load MOS transistor of the first conductivity type which has one end connected to the power supply, is diode-connected, and has the same size as the first load MOS transistor;

a second reference MOS transistor which is connected between an other end of the fourth load MOS transistor and the ground, has a gate connected to a gate of the first reference MOS transistor, has the same size as the first reference MOS transistor, and is fed with the current obtained by current mirroring the current passing through the first reference MOS transistor;

dummy cells connected in parallel with the second reference MOS transistor between the other end of the fourth load MOS transistor and the ground; and a differential amplifier circuit which is fed with an output potential of the first-stage amplifier circuit and a potential between the fourth load MOS transistor and the second reference MOS transistor, compares these potentials, and outputs a signal corresponding to a comparison result, wherein the semiconductor memory comprises the plurality of memory cells, the semiconductor memory comprises the plurality of first-stage amplifier circuits and differential amplifier circuits for the respective memory cells, the gate of the first reference MOS transistor has a potential applied in common to the gates of the amplifier reference MOS transistors of the plurality of first-stage amplifier circuits, and the potential between the fourth load MOS transistor and the second reference MOS transistor is inputted in common to the plurality of differential amplifier circuits.

9. The semiconductor memory according to claim 8, further comprising a boot capacitor having one end connected to the gate of the amplifier input MOS transistor, wherein a potential on an other end of the boot capacitor is boosted when the first-stage amplifier circuit is started.

10. The semiconductor memory according to claim 8, wherein the semiconductor memory is a NOR flash memory.

11. The semiconductor memory according to claim 1, further comprising a boot capacitor having one end connected to the gate of the amplifier input MOS transistor, wherein a potential on an other end of the boot capacitor is boosted when the first-stage amplifier circuit is started.

12. The semiconductor memory according to claim 11, wherein the semiconductor memory is a NOR flash memory.

13. The semiconductor memory according to claim 1, wherein the semiconductor memory is a NOR flash memory.

14. A semiconductor memory, comprising:

a first load MOS transistor of a first conductivity type which has one end connected to a power supply and is diode-connected;

nonvolatile memory cells which are connected between an other end of the first load MOS transistor and ground and have adjustable threshold voltages;

a second load MOS transistor of the first conductivity type which has one end connected to the power supply, is diode-connected, and has the same size as the first load MOS transistor;

nonvolatile reference cells which are connected between an other end of the second load MOS transistor and the ground and have adjustable threshold voltages;

a third load MOS transistor of the first conductivity type which has one end connected to the power supply, has a gate connected to a gate of the second load MOS transistor, has the same size as the first load MOS transistor, and is fed with a current obtained by current mirroring a current passing through the second load MOS transistor;

a first reference MOS transistor of a second conductivity type which is connected between an other end of the third load MOS transistor and the ground and is diode-connected;

an amplifier input MOS transistor of the first conductivity type which has one end connected to the power supply, has a gate connected to the other end of the first load MOS transistor, has the same size as the first load MOS transistor, and composes a first-stage amplifier circuit; and an amplifier reference MOS transistor of the second conductivity type which is connected between an other end of the amplifier input MOS transistor and the ground, has the same size as the first reference MOS transistor, is fed with a current obtained by current mirroring a current passing through the first reference MOS transistor, and composes the first-stage amplifier circuit;

a fourth load MOS transistor of the first conductivity type which has one end connected to the power supply, is diode-connected, and has the same size as the first load MOS transistor;

a second reference MOS transistor of the second conductivity type which is connected between an other end of the fourth load MOS transistor and the ground, has a gate connected to a gate of the first reference MOS transistor, has the same size as the first reference MOS transistor, and is fed with the current obtained by current mirroring the current passing through the first reference MOS transistor;

dummy cells connected in parallel with the second reference MOS transistor between the other end of the fourth load MOS transistor and the ground; and a differential amplifier circuit which is fed with the potential between the amplifier input MOS transistor and the amplifier reference MOS transistor as an output from the first-stage amplifier circuit and is fed with a potential between the fourth load MOS transistor and the second reference MOS transistor, compares these potentials, and outputs a signal corresponding to a comparison result, wherein data stored in the memory cells is read based on an output signal of the differential amplifier circuit.

15. The semiconductor memory according to claim 14, wherein the semiconductor memory is a NOR flash memory.

16. A semiconductor memory, comprising:
a first load MOS transistor of a first conductivity type which has one end connected to a power supply and is diode-connected;

nonvolatile memory cells which are connected between an other end of the first load MOS transistor and ground and have adjustable threshold voltages;

a second load MOS transistor of the first conductivity type which has one end connected to the power supply, is diode-connected, and has the same size as the first load MOS transistor;

nonvolatile reference cells which are connected between an other end of the second load MOS transistor and the ground and have adjustable threshold voltages;

a third load MOS transistor of the first conductivity type which has one end connected to the power supply, has a gate connected to a gate of the second load MOS transistor, has the same size as the first load MOS transistor, and is fed with a current obtained by current mirroring a current passing through the second load MOS transistor;

a first reference MOS transistor of a second conductivity type which is connected between an other end of the third load MOS transistor and the ground and is diode-connected;

an amplifier input MOS transistor of the first conductivity type which has one end connected to the power supply, has a gate connected to the other end of the first load MOS transistor, has the same size as the first load MOS transistor, and composes a first-stage amplifier circuit; and an amplifier reference MOS transistor of the second conductivity type which is connected between an other end of the amplifier input MOS transistor and the ground, has the same size as the first reference MOS transistor, is fed with a current obtained by current mirroring a current passing through the first reference MOS transistor, and composes the first-stage amplifier circuit; and a differential amplifier circuit which is fed with the potential between the amplifier input MOS transistor and the amplifier reference MOS transistor as an output from the first-stage amplifier circuit and is fed with a potential between a power supply potential and a ground potential, compares these potentials, and outputs a signal corresponding to a comparison result, wherein data stored in the memory cells is read based on an output signal of the differential amplifier circuit.

17. The semiconductor memory according to claim 16, wherein the semiconductor memory is a NOR flash memory.

* * * * *